(12) United States Patent
Dunklee et al.

(10) Patent No.: US 7,639,003 B2
(45) Date of Patent: Dec. 29, 2009

(54) GUARDED TUB ENCLOSURE

(75) Inventors: John Dunklee, Tigard, OR (US); Greg Norgden, Logan, UT (US); C. Eugene Cowan, Beaverton, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 165 days.

(21) Appl. No.: 11/786,641

(22) Filed: Apr. 11, 2007

(65) Prior Publication Data

US 2007/0194778 A1    Aug. 23, 2007

Related U.S. Application Data

(63) Continuation of application No. 11/035,543, filed on Jan. 14, 2005, now Pat. No. 7,221,146, which is a continuation of application No. 10/319,287, filed on Dec. 13, 2002, now Pat. No. 6,861,856.

(51) Int. Cl.
G01R 31/28    (2006.01)
(52) U.S. Cl. .................................... 324/158.1
(58) Field of Classification Search .............. 324/754, 324/765, 760, 158.1; 257/48; 438/14–18; 361/818
See application file for complete search history.

(56) References Cited

U.S. PATENT DOCUMENTS

| | | |
|---|---|---|
| 1,191,486 A | 7/1916 | Tyler |
| 1,337,866 A | 4/1920 | Whitaker |
| 2,106,003 A | 1/1938 | Hewitt |
| 2,142,625 A | 1/1939 | Zoethout |
| 2,197,081 A | 4/1940 | Piron |
| 2,264,685 A | 12/1941 | Wells |
| 2,376,101 A | 5/1945 | Tyzzer |
| 2,389,668 A | 11/1945 | Johnson |
| 2,471,897 A | 5/1949 | Rappi |
| 2,812,502 A | 11/1957 | Doherty |
| 3,176,091 A | 3/1965 | Hanson et al. |
| 3,185,927 A | 5/1965 | Margulis et al. |
| 3,192,844 A | 7/1965 | Szasz et al. |
| 3,193,712 A | 7/1965 | Harris |
| 3,201,721 A | 8/1965 | Voelcker |
| 3,230,299 A | 1/1966 | Radziejowski |
| 3,256,484 A | 6/1966 | Terry |
| 3,265,969 A | 8/1966 | Catu |
| 3,289,046 A | 11/1966 | Carr |

(Continued)

FOREIGN PATENT DOCUMENTS

CN    1083975    3/1994

(Continued)

OTHER PUBLICATIONS

Christophe Risacher, Vessen Vassilev, Alexey Pavolotsky, and Victor Belitsky, "Waveguide-to-Microstrip Transition With Integrated Bias-T," IEEE Microwave and Wireless Components Letters, vol. 13, No. 7, Jul. 2003, pp. 262-264.

(Continued)

*Primary Examiner*—Ha Tran T Nguyen
*Assistant Examiner*—Tung X Nguyen
(74) *Attorney, Agent, or Firm*—Chernoff, Vilhauer, McClung & Stenzel

(57) ABSTRACT

A probe station with an improved guarding structure.

6 Claims, 11 Drawing Sheets

U.S. PATENT DOCUMENTS

| | | |
|---|---|---|
| 3,333,274 A | 7/1967 | Forcier |
| 3,359,014 A | 12/1967 | Clements |
| 3,405,361 A | 10/1968 | Kattner et al. |
| 3,408,565 A | 10/1968 | Frick et al. |
| 3,435,185 A | 3/1969 | Gerard |
| 3,484,679 A | 12/1969 | Hodgson et al. |
| 3,596,228 A | 7/1971 | Reed, Jr. et al. |
| 3,602,845 A | 8/1971 | Agrios et al. |
| 3,609,539 A | 9/1971 | Gunthert |
| 3,642,415 A | 2/1972 | Johnson |
| 3,648,169 A | 3/1972 | Wiesler |
| 3,654,573 A | 4/1972 | Graham |
| 3,662,318 A | 5/1972 | Decuyper |
| 3,666,296 A | 5/1972 | Fischetti |
| 3,700,998 A | 10/1972 | Lee et al. |
| 3,710,251 A | 1/1973 | Hagge et al. |
| 3,714,572 A | 1/1973 | Ham et al. |
| 3,740,900 A | 6/1973 | Youmans et al. |
| 3,775,644 A | 11/1973 | Cotner et al. |
| 3,777,260 A | 12/1973 | Davies et al. |
| 3,810,017 A | 5/1974 | Wiesler et al. |
| 3,814,838 A | 6/1974 | Shafer |
| 3,814,888 A | 6/1974 | Bowers et al. |
| 3,829,076 A | 8/1974 | Sofy |
| 3,836,751 A | 9/1974 | Anderson |
| 3,858,212 A | 12/1974 | Tompkins et al. |
| 3,863,181 A | 1/1975 | Glance et al. |
| 3,866,093 A | 2/1975 | Kusters et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,976,959 A | 8/1976 | Gaspari |
| 3,992,073 A | 11/1976 | Buchoff et al. |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,035,723 A | 7/1977 | Kvaternik |
| 4,038,894 A | 8/1977 | Knibbe et al. |
| 4,042,119 A | 8/1977 | Hassan et al. |
| 4,049,252 A | 9/1977 | Bell |
| 4,066,943 A | 1/1978 | Roch |
| 4,072,576 A | 2/1978 | Arwin et al. |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly et al. |
| 4,135,131 A | 1/1979 | Larsen et al. |
| 4,151,465 A | 4/1979 | Lenz |
| 4,161,692 A | 7/1979 | Tarzwell |
| 4,172,993 A | 10/1979 | Leach |
| 4,186,338 A | 1/1980 | Fichtenbaum |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | delRio |
| 4,284,682 A | 8/1981 | Frosch et al. |
| 4,287,473 A | 9/1981 | Sawyer |
| 4,327,180 A | 4/1982 | Chen |
| 4,330,783 A | 5/1982 | Toia |
| 4,342,958 A | 8/1982 | Russell |
| 4,346,355 A | 8/1982 | Tsukii |
| 4,352,061 A | 9/1982 | Matrone |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,376,920 A | 3/1983 | Smith |
| 4,383,178 A | 5/1983 | Shibata et al. |
| 4,383,217 A | 5/1983 | Shiell |
| 4,401,945 A | 8/1983 | Juengel |
| 4,414,638 A | 11/1983 | Talambiras |
| 4,419,626 A | 12/1983 | Cedrone et al. |
| 4,425,395 A | 1/1984 | Negishi et al. |
| 4,426,619 A | 1/1984 | Demand |
| 4,431,967 A | 2/1984 | Nishioka |
| 4,453,142 A | 6/1984 | Murphy |
| 4,468,629 A | 8/1984 | Choma, Jr. |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,515,133 A | 5/1985 | Roman |
| 4,515,439 A | 5/1985 | Esswein |
| 4,528,504 A | 7/1985 | Thornton, Jr. et al. |
| 4,531,474 A | 7/1985 | Inuta |
| 4,532,423 A | 7/1985 | Tojo et al. |
| 4,552,033 A | 11/1985 | Marzhauser |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A | 3/1986 | Palkuti |
| 4,588,950 A | 5/1986 | Henley |
| 4,588,970 A | 5/1986 | Donecker et al. |
| 4,621,169 A | 11/1986 | Petinelli et al. |
| 4,626,618 A | 12/1986 | Takaoka et al. |
| 4,641,659 A | 2/1987 | Sepponen |
| 4,642,417 A | 2/1987 | Ruthrof et al. |
| 4,646,005 A | 2/1987 | Ryan |
| 4,651,115 A | 3/1987 | Wu |
| 4,665,360 A | 5/1987 | Phillips |
| 4,673,839 A | 6/1987 | Veenendaal |
| 4,675,600 A | 6/1987 | Gergin |
| 4,680,538 A | 7/1987 | Dalman et al. |
| 4,684,783 A | 8/1987 | Gore |
| 4,684,883 A | 8/1987 | Ackerman et al. |
| 4,691,163 A | 9/1987 | Blass et al. |
| 4,691,831 A | 9/1987 | Suzuki et al. |
| 4,694,245 A | 9/1987 | Frommes |
| 4,695,794 A | 9/1987 | Bargett et al. |
| 4,697,143 A | 9/1987 | Lockwood et al. |
| 4,703,433 A | 10/1987 | Sharrit |
| 4,705,447 A | 11/1987 | Smith |
| 4,709,141 A | 11/1987 | Olsen et al. |
| 4,711,563 A | 12/1987 | Lass |
| 4,712,370 A | 12/1987 | MacGee |
| 4,713,347 A | 12/1987 | Mitchell et al. |
| 4,725,793 A | 2/1988 | Igarashi |
| 4,727,637 A | 3/1988 | Buckwitz et al. |
| 4,730,158 A | 3/1988 | Kasai et al. |
| 4,731,577 A | 3/1988 | Logan |
| 4,734,872 A | 3/1988 | Eager et al. |
| 4,739,259 A | 4/1988 | Hadwin et al. |
| 4,742,571 A | 5/1988 | Letron |
| 4,744,041 A | 5/1988 | Strunk et al. |
| 4,746,857 A | 5/1988 | Sakai et al. |
| 4,754,239 A | 6/1988 | Sedivec |
| 4,755,746 A | 7/1988 | Mallory et al. |
| 4,755,747 A | 7/1988 | Sato |
| 4,755,874 A | 7/1988 | Esrig et al. |
| 4,757,255 A | 7/1988 | Margozzi |
| 4,758,785 A | 7/1988 | Rath |
| 4,759,712 A | 7/1988 | Demand |
| 4,766,384 A | 8/1988 | Kleinberg et al. |
| 4,771,234 A | 9/1988 | Cook et al. |
| 4,772,846 A | 9/1988 | Reeds |
| 4,777,434 A | 10/1988 | Miller et al. |

| | | | | | |
|---|---|---|---|---|---|
| 4,780,670 A | 10/1988 | Cherry | 5,091,732 A | 2/1992 | Mileski et al. |
| 4,783,625 A | 11/1988 | Harry et al. | 5,094,536 A | 3/1992 | MacDonald et al. |
| 4,784,213 A | 11/1988 | Eager et al. | 5,095,891 A | 3/1992 | Reitter |
| 4,786,867 A | 11/1988 | Yamatsu | 5,097,207 A | 3/1992 | Blanz |
| 4,787,752 A | 11/1988 | Fraser et al. | 5,101,149 A | 3/1992 | Adams et al. |
| 4,791,363 A | 12/1988 | Logan | 5,101,453 A | 3/1992 | Rumbaugh |
| 4,795,962 A | 1/1989 | Yanagawa et al. | 5,103,169 A | 4/1992 | Heaton et al. |
| 4,805,627 A | 2/1989 | Klingenbeck et al. | 5,105,148 A | 4/1992 | Lee |
| 4,810,981 A | 3/1989 | Herstein | 5,105,181 A | 4/1992 | Ross |
| 4,812,754 A | 3/1989 | Tracy et al. | 5,107,076 A | 4/1992 | Bullock et al. |
| 4,816,767 A | 3/1989 | Cannon et al. | 5,136,237 A | 8/1992 | Smith et al. |
| 4,818,169 A | 4/1989 | Schram et al. | 5,142,224 A | 8/1992 | Smith et al. |
| 4,827,211 A | 5/1989 | Strid et al. | 5,144,228 A | 9/1992 | Sorna et al. |
| 4,831,494 A | 5/1989 | Arnold et al. | 5,159,264 A | 10/1992 | Anderson |
| 4,838,802 A | 6/1989 | Soar | 5,159,267 A | 10/1992 | Anderson |
| 4,839,587 A | 6/1989 | Flatley et al. | 5,159,752 A | 11/1992 | Mahant-Shetti et al. |
| 4,845,426 A | 7/1989 | Nolan et al. | 5,160,883 A | 11/1992 | Blanz |
| 4,849,689 A | 7/1989 | Gleason | 5,164,319 A | 11/1992 | Hafeman et al. |
| 4,853,613 A | 8/1989 | Sequeira et al. | 5,164,661 A | 11/1992 | Jones |
| 4,853,624 A | 8/1989 | Rabjohn | 5,166,606 A | 11/1992 | Blanz |
| 4,853,627 A | 8/1989 | Gleason et al. | 5,172,049 A | 12/1992 | Kiyokawa et al. |
| 4,856,426 A | 8/1989 | Wirz | 5,172,051 A | 12/1992 | Zamborelli |
| 4,856,904 A | 8/1989 | Akagawa | 5,187,443 A | 2/1993 | Bereskin |
| 4,858,160 A | 8/1989 | Strid et al. | 5,198,752 A | 3/1993 | Miyata et al. |
| 4,859,989 A | 8/1989 | McPherson | 5,198,753 A | 3/1993 | Hamburgen |
| 4,864,227 A | 9/1989 | Sato | 5,198,756 A | 3/1993 | Jenkins et al. |
| 4,871,883 A | 10/1989 | Guiol | 5,198,758 A | 3/1993 | Iknaian et al. |
| 4,871,965 A | 10/1989 | Elbert et al. | 5,202,558 A | 4/1993 | Barker |
| 4,884,026 A | 11/1989 | Hayakawa et al. | 5,209,088 A | 5/1993 | Vaks |
| 4,884,206 A | 11/1989 | Mate | 5,210,377 A | 5/1993 | Kennedy et al. |
| 4,888,550 A | 12/1989 | Reid | 5,210,485 A | 5/1993 | Kreiger et al. |
| 4,891,584 A | 1/1990 | Kamieniecki et al. | 5,214,243 A | 5/1993 | Johnson |
| 4,893,914 A | 1/1990 | Hancock et al. | 5,214,374 A | 5/1993 | St. Onge |
| 4,894,612 A | 1/1990 | Drake et al. | 5,218,185 A | 6/1993 | Gross |
| 4,896,109 A | 1/1990 | Rauscher | 5,220,277 A | 6/1993 | Reitinger |
| 4,899,998 A | 2/1990 | Teramachi | 5,221,905 A | 6/1993 | Bhangu et al. |
| 4,904,933 A | 2/1990 | Snyder et al. | 5,225,037 A | 7/1993 | Elder et al. |
| 4,904,935 A | 2/1990 | Calma et al. | 5,225,796 A | 7/1993 | Williams et al. |
| 4,906,920 A | 3/1990 | Huff et al. | 5,227,730 A | 7/1993 | King et al. |
| 4,916,398 A | 4/1990 | Rath | 5,232,789 A | 8/1993 | Platz et al. |
| 4,918,279 A | 4/1990 | Babel et al. | 5,233,197 A | 8/1993 | Bowman et al. |
| 4,918,374 A | 4/1990 | Stewart et al. | 5,233,291 A | 8/1993 | Kouno et al. |
| 4,918,383 A | 4/1990 | Huff et al. | 5,233,306 A | 8/1993 | Misra |
| 4,922,128 A | 5/1990 | Dhong et al. | 5,237,267 A | 8/1993 | Harwood et al. |
| 4,922,186 A | 5/1990 | Tsuchiya et al. | 5,245,292 A | 9/1993 | Milesky et al. |
| 4,923,407 A | 5/1990 | Rice et al. | 5,266,889 A | 11/1993 | Harwood et al. |
| 4,926,118 A | 5/1990 | O'Connor et al. | 5,267,088 A | 11/1993 | Nomura |
| 4,929,893 A | 5/1990 | Sato et al. | 5,270,664 A | 12/1993 | McMurtry et al. |
| 4,933,634 A | 6/1990 | Cuzin et al. | 5,274,336 A | 12/1993 | Crook et al. |
| 4,968,931 A | 11/1990 | Littlebury et al. | 5,278,494 A | 1/1994 | Obigane |
| 4,978,907 A | 12/1990 | Smith | 5,280,156 A | 1/1994 | Niori et al. |
| 4,978,914 A | 12/1990 | Akimoto et al. | 5,298,972 A | 3/1994 | Heffner |
| 4,982,153 A | 1/1991 | Collins et al. | 5,303,938 A | 4/1994 | Miller et al. |
| 4,994,737 A | 2/1991 | Carlton et al. | 5,304,924 A | 4/1994 | Yamano et al. |
| 5,001,423 A | 3/1991 | Abrami et al. | 5,315,237 A | 5/1994 | Iwakura et al. |
| 5,006,796 A | 4/1991 | Burton et al. | 5,321,352 A | 6/1994 | Takebuchi |
| 5,010,296 A | 4/1991 | Okada et al. | 5,321,453 A | 6/1994 | Mori et al. |
| 5,019,692 A | 5/1991 | Nbedi et al. | 5,325,052 A | 6/1994 | Yamashita |
| 5,030,907 A | 7/1991 | Yih et al. | 5,334,931 A | 8/1994 | Clarke et al. |
| 5,034,688 A | 7/1991 | Moulene et al. | 5,336,989 A | 8/1994 | Hofer |
| 5,041,782 A | 8/1991 | Marzan | 5,345,170 A | 9/1994 | Schwindt et al. |
| 5,045,781 A | 9/1991 | Gleason et al. | 5,357,211 A | 10/1994 | Bryson et al. |
| 5,061,823 A | 10/1991 | Carroll | 5,363,050 A | 11/1994 | Guo et al. |
| 5,065,089 A | 11/1991 | Rich | 5,369,368 A | 11/1994 | Kassen et al. |
| 5,065,092 A | 11/1991 | Sigler | 5,369,370 A | 11/1994 | Stratmann et al. |
| 5,066,357 A | 11/1991 | Smyth, Jr. et al. | 5,371,457 A | 12/1994 | Lipp |
| 5,070,297 A | 12/1991 | Kwon et al. | 5,373,231 A | 12/1994 | Boll et al. |
| 5,077,523 A | 12/1991 | Blanz | 5,374,938 A | 12/1994 | Hatazawa et al. |
| 5,082,627 A | 1/1992 | Stanbro | 5,376,790 A | 12/1994 | Linker et al. |
| 5,084,671 A | 1/1992 | Miyata et al. | 5,382,898 A | 1/1995 | Subramanian |
| 5,089,774 A | 2/1992 | Nakano | 5,397,855 A | 3/1995 | Ferlier |
| 5,091,691 A | 2/1992 | Kamieniecki et al. | 5,404,111 A | 4/1995 | Mori et al. |
| 5,091,692 A | 2/1992 | Ohno et al. | 5,408,188 A | 4/1995 | Katoh |

| Patent | Date | Inventor |
|---|---|---|
| 5,408,189 A | 4/1995 | Swart et al. |
| 5,410,259 A | 4/1995 | Fujihara et al. |
| 5,412,330 A | 5/1995 | Ravel et al. |
| 5,412,866 A | 5/1995 | Woith et al. |
| 5,414,565 A | 5/1995 | Sullivan et al. |
| 5,422,574 A | 6/1995 | Kister |
| 5,434,512 A | 7/1995 | Schwindt et al. |
| 5,448,172 A | 9/1995 | Dechene et al. |
| 5,451,884 A | 9/1995 | Sauerland |
| 5,457,398 A | 10/1995 | Schwindt et al. |
| 5,461,328 A | 10/1995 | Devereaux et al. |
| 5,467,024 A | 11/1995 | Swapp |
| 5,469,324 A | 11/1995 | Henderson et al. |
| 5,475,316 A | 12/1995 | Hurley et al. |
| 5,477,011 A | 12/1995 | Singles et al. |
| 5,478,748 A | 12/1995 | Akins, Jr. et al. |
| 5,479,108 A | 12/1995 | Cheng |
| 5,479,109 A | 12/1995 | Lau et al. |
| 5,481,196 A | 1/1996 | Nosov |
| 5,481,936 A | 1/1996 | Yanagisawa |
| 5,486,975 A | 1/1996 | Shamouilian et al. |
| 5,488,954 A | 2/1996 | Sleva et al. |
| 5,491,426 A | 2/1996 | Small |
| 5,493,070 A | 2/1996 | Habu |
| 5,493,236 A | 2/1996 | Ishii et al. |
| 5,500,606 A | 3/1996 | Holmes |
| 5,505,150 A | 4/1996 | James et al. |
| 5,506,498 A | 4/1996 | Anderson et al. |
| 5,506,515 A | 4/1996 | Godshalk et al. |
| 5,508,631 A | 4/1996 | Manku et al. |
| 5,510,792 A | 4/1996 | Ono et al. |
| 5,511,010 A | 4/1996 | Burns |
| 5,512,835 A | 4/1996 | Rivera et al. |
| 5,515,167 A | 5/1996 | Ledger et al. |
| 5,517,111 A | 5/1996 | Shelor |
| 5,521,522 A | 5/1996 | Abe et al. |
| 5,523,694 A | 6/1996 | Cole, Jr. |
| 5,528,158 A | 6/1996 | Sinsheimer et al. |
| 5,530,371 A | 6/1996 | Perry et al. |
| 5,530,372 A | 6/1996 | Lee et al. |
| 5,532,609 A | 7/1996 | Harwood et al. |
| 5,539,323 A | 7/1996 | Davis, Jr. |
| 5,539,676 A | 7/1996 | Yamaguchi |
| 5,546,012 A | 8/1996 | Perry et al. |
| 5,550,480 A | 8/1996 | Nelson et al. |
| 5,550,482 A | 8/1996 | Sano |
| 5,552,716 A | 9/1996 | Takahashi et al. |
| 5,554,236 A | 9/1996 | Singles et al. |
| 5,561,377 A | 10/1996 | Strid et al. |
| 5,561,585 A | 10/1996 | Barnes et al. |
| 5,565,788 A | 10/1996 | Burr et al. |
| 5,565,881 A | 10/1996 | Phillips et al. |
| 5,569,591 A | 10/1996 | Kell et al. |
| 5,571,324 A | 11/1996 | Sago et al. |
| 5,572,398 A | 11/1996 | Federlin et al. |
| 5,578,932 A | 11/1996 | Adamian |
| 5,583,445 A | 12/1996 | Mullen |
| 5,584,608 A | 12/1996 | Gillespie |
| 5,594,358 A | 1/1997 | Ishikawa et al. |
| 5,600,256 A | 2/1997 | Woith et al. |
| 5,604,444 A | 2/1997 | Harwood et al. |
| 5,610,529 A | 3/1997 | Schwindt |
| 5,611,946 A | 3/1997 | Leong et al. |
| 5,617,035 A | 4/1997 | Swapp |
| 5,628,057 A | 5/1997 | Phillips et al. |
| 5,629,631 A | 5/1997 | Perry et al. |
| 5,631,571 A | 5/1997 | Spaziani et al. |
| 5,633,780 A | 5/1997 | Cronin |
| 5,640,101 A | 6/1997 | Kuji et al. |
| 5,642,298 A | 6/1997 | Mallory et al. |
| 5,644,248 A | 7/1997 | Fujimoto |
| 5,646,538 A | 7/1997 | Lide et al. |
| 5,653,939 A | 8/1997 | Hollis et al. |
| 5,656,942 A | 8/1997 | Watts et al. |
| 5,657,394 A | 8/1997 | Schwartz et al. |
| 5,659,255 A | 8/1997 | Strid et al. |
| 5,659,421 A | 8/1997 | Rahmel et al. |
| 5,663,653 A | 9/1997 | Schwindt et al. |
| 5,666,063 A | 9/1997 | Abercrombie et al. |
| 5,668,470 A | 9/1997 | Shelor |
| 5,669,316 A | 9/1997 | Faz et al. |
| 5,670,322 A | 9/1997 | Eggers et al. |
| 5,670,888 A | 9/1997 | Cheng |
| 5,672,816 A | 9/1997 | Park et al. |
| 5,675,499 A | 10/1997 | Lee et al. |
| 5,675,932 A | 10/1997 | Mauney |
| 5,676,360 A | 10/1997 | Boucher et al. |
| 5,680,039 A | 10/1997 | Mochizuki et al. |
| 5,682,337 A | 10/1997 | El-Fishawy et al. |
| 5,685,232 A | 11/1997 | Inoue |
| 5,704,355 A | 1/1998 | Bridges |
| 5,712,571 A | 1/1998 | O'Donoghue |
| 5,715,819 A | 2/1998 | Svenson et al. |
| 5,729,150 A | 3/1998 | Schwindt |
| 5,731,708 A | 3/1998 | Sobhami |
| 5,731,920 A | 3/1998 | Katsuragawa |
| 5,744,971 A | 4/1998 | Chan et al. |
| 5,748,506 A | 5/1998 | Bockelman |
| 5,751,252 A | 5/1998 | Phillips |
| 5,767,690 A | 6/1998 | Fujimoto |
| 5,773,951 A | 6/1998 | Markowski et al. |
| 5,777,485 A | 7/1998 | Tanaka et al. |
| 5,792,668 A | 8/1998 | Fuller et al. |
| 5,793,213 A | 8/1998 | Bockelman et al. |
| 5,794,133 A | 8/1998 | Kashima |
| 5,798,652 A | 8/1998 | Taraci |
| 5,802,856 A | 9/1998 | Schaper et al. |
| 5,804,982 A | 9/1998 | Lo et al. |
| 5,804,983 A | 9/1998 | Nakajima et al. |
| 5,807,107 A | 9/1998 | Bright et al. |
| 5,811,751 A | 9/1998 | Leong et al. |
| 5,824,494 A | 10/1998 | Feldberg |
| 5,828,225 A | 10/1998 | Obikane et al. |
| 5,829,437 A | 11/1998 | Bridges |
| 5,831,442 A | 11/1998 | Heigl |
| 5,833,601 A | 11/1998 | Swartz et al. |
| 5,835,997 A * | 11/1998 | Yassine ...................... 324/754 |
| 5,838,161 A | 11/1998 | Akram et al. |
| 5,841,288 A | 11/1998 | Meaney et al. |
| 5,846,708 A | 12/1998 | Hollis et al. |
| 5,847,569 A | 12/1998 | Ho et al. |
| 5,848,500 A | 12/1998 | Kirk |
| 5,852,232 A | 12/1998 | Samsavar et al. |
| 5,854,608 A | 12/1998 | Leisten |
| 5,857,667 A | 1/1999 | Lee |
| 5,861,743 A | 1/1999 | Pye et al. |
| 5,867,073 A | 2/1999 | Weinreb et al. |
| 5,869,326 A | 2/1999 | Hofmann |
| 5,869,975 A | 2/1999 | Strid et al. |
| 5,874,361 A | 2/1999 | Collins et al. |
| 5,879,289 A | 3/1999 | Yarush et al. |
| 5,883,522 A | 3/1999 | O'Boyle |
| 5,883,523 A | 3/1999 | Ferland et al. |
| 5,888,075 A | 3/1999 | Hasegawa et al. |
| 5,892,539 A | 4/1999 | Colvin |
| 5,900,737 A | 5/1999 | Graham et al. |
| 5,903,143 A | 5/1999 | Mochizuki et al. |
| 5,905,421 A | 5/1999 | Oldfield |
| 5,910,727 A | 6/1999 | Fujihara et al. |
| 5,916,689 A | 6/1999 | Collins et al. |
| 5,923,177 A | 7/1999 | Wardwell |
| 5,926,028 A | 7/1999 | Mochizuki |
| 5,942,907 A | 8/1999 | Chiang |
| 5,944,093 A | 8/1999 | Viswanath |
| 5,945,836 A | 8/1999 | Sayre et al. |
| 5,949,383 A | 9/1999 | Hayes et al. |

| | | | | | | |
|---|---|---|---|---|---|---|
| 5,949,579 A | 9/1999 | Baker | | 6,181,297 B1 | 1/2001 | Leisten |
| 5,952,842 A | 9/1999 | Fujimoto | | 6,181,416 B1 | 1/2001 | Falk |
| 5,959,461 A | 9/1999 | Brown et al. | | 6,184,845 B1 | 2/2001 | Leisten et al. |
| 5,960,411 A | 9/1999 | Hartman et al. | | 6,191,596 B1 | 2/2001 | Abiko |
| 5,963,027 A | 10/1999 | Peters | | 6,194,720 B1 | 2/2001 | Li et al. |
| 5,963,364 A | 10/1999 | Leong et al. | | 6,194,907 B1 | 2/2001 | Kanao et al. |
| 5,970,429 A | 10/1999 | Martin | | 6,198,299 B1 | 3/2001 | Hollman |
| 5,973,505 A | 10/1999 | Strid et al. | | 6,211,663 B1 | 4/2001 | Moulthrop et al. |
| 5,974,662 A | 11/1999 | Eldridge et al. | | 6,211,837 B1 | 4/2001 | Crouch et al. |
| 5,981,268 A | 11/1999 | Kovacs et al. | | 6,215,295 B1 | 4/2001 | Smith, III |
| 5,982,166 A | 11/1999 | Mautz | | 6,222,031 B1 | 4/2001 | Wakabayashi et al. |
| 5,993,611 A | 11/1999 | Moroney, III et al. | | 6,222,970 B1 | 4/2001 | Wach et al. |
| 5,995,914 A | 11/1999 | Cabot | | 6,229,322 B1 | 5/2001 | Hembree |
| 5,996,102 A | 11/1999 | Haulin | | 6,229,327 B1 | 5/2001 | Boll et al. |
| 5,998,768 A | 12/1999 | Hunter et al. | | 6,232,787 B1 | 5/2001 | Lo et al. |
| 5,999,268 A | 12/1999 | Yonezawa et al. | | 6,232,788 B1 | 5/2001 | Schwindt et al. |
| 6,001,760 A | 12/1999 | Katsuda et al. | | 6,232,789 B1 | 5/2001 | Schwindt |
| 6,002,236 A | 12/1999 | Trant et al. | | 6,232,790 B1 | 5/2001 | Bryan et al. |
| 6,002,263 A | 12/1999 | Peters et al. | | 6,233,613 B1 | 5/2001 | Walker et al. |
| 6,002,426 A | 12/1999 | Back et al. | | 6,236,223 B1 | 5/2001 | Brady et al. |
| 6,013,586 A | 1/2000 | McGhee et al. | | 6,236,975 B1 | 5/2001 | Boe et al. |
| 6,019,612 A | 2/2000 | Hasegawa et al. | | 6,236,977 B1 | 5/2001 | Verba et al. |
| 6,023,209 A | 2/2000 | Faulkner et al. | | 6,242,929 B1 | 6/2001 | Mizuta |
| 6,028,435 A | 2/2000 | Nikawa | | 6,245,692 B1 | 6/2001 | Pearce et al. |
| 6,029,141 A | 2/2000 | Bezos et al. | | 6,251,595 B1 | 6/2001 | Gordon et al. |
| 6,031,383 A | 2/2000 | Streib et al. | | 6,252,392 B1 | 6/2001 | Peters |
| 6,032,714 A | 3/2000 | Fenton | | 6,257,319 B1 | 7/2001 | Kainuma et al. |
| 6,034,533 A | 3/2000 | Tervo et al. | | 6,257,564 B1 | 7/2001 | Avneri et al. |
| 6,037,785 A | 3/2000 | Higgins | | 6,259,261 B1 | 7/2001 | Engelking et al. |
| 6,037,793 A | 3/2000 | Miyazawa et al. | | 6,265,950 B1 | 7/2001 | Schmidt et al. |
| 6,043,667 A | 3/2000 | Cadwallader et al. | | 6,271,673 B1 | 8/2001 | Furuta et al. |
| 6,043,668 A | 3/2000 | Carney | | 6,275,738 B1 | 8/2001 | Kasevich et al. |
| 6,049,216 A | 4/2000 | Yang et al. | | 6,278,051 B1 | 8/2001 | Peabody |
| 6,051,422 A | 4/2000 | Kovacs et al. | | 6,278,411 B1 | 8/2001 | Ohlsson et al. |
| 6,052,653 A | 4/2000 | Mazur et al. | | 6,281,691 B1 | 8/2001 | Matsunaga et al. |
| 6,054,869 A | 4/2000 | Hutton et al. | | 6,284,971 B1 | 9/2001 | Atalar et al. |
| 6,060,888 A | 5/2000 | Blackham et al. | | 6,288,557 B1 | 9/2001 | Peters et al. |
| 6,060,891 A | 5/2000 | Hembree et al. | | 6,292,760 B1 | 9/2001 | Burns |
| 6,060,892 A | 5/2000 | Yamagata | | 6,300,775 B1 | 10/2001 | Peach et al. |
| 6,061,589 A | 5/2000 | Bridges et al. | | 6,307,672 B1 | 10/2001 | DeNure |
| 6,064,213 A | 5/2000 | Khandros et al. | | 6,310,483 B1 | 10/2001 | Taura et al. |
| 6,064,217 A | 5/2000 | Smith | | 6,310,755 B1 | 10/2001 | Kholodenko et al. |
| 6,064,218 A | 5/2000 | Godfrey et al. | | 6,313,567 B1 | 11/2001 | Maltabes et al. |
| 6,066,911 A | 5/2000 | Lindemann et al. | | 6,313,649 B2 | 11/2001 | Harwood et al. |
| 6,078,183 A | 6/2000 | Cole, Jr. | | 6,320,372 B1 | 11/2001 | Keller |
| 6,091,236 A | 7/2000 | Piety et al. | | 6,320,396 B1 | 11/2001 | Nikawa |
| 6,091,255 A | 7/2000 | Godfrey | | 6,327,034 B1 | 12/2001 | Hoover et al. |
| 6,096,567 A | 8/2000 | Kaplan et al. | | 6,335,625 B1 | 1/2002 | Bryant et al. |
| 6,100,815 A | 8/2000 | Pailthorp | | 6,335,628 B2 | 1/2002 | Schwindt et al. |
| 6,104,203 A | 8/2000 | Costello et al. | | 6,340,568 B2 | 1/2002 | Hefti |
| 6,104,206 A | 8/2000 | Verkuil | | 6,340,895 B1 | 1/2002 | Uher et al. |
| 6,111,419 A | 8/2000 | Lefever et al. | | 6,359,456 B1 | 3/2002 | Hembree et al. |
| 6,114,865 A | 9/2000 | Lagowski et al. | | 6,362,636 B1 | 3/2002 | Peters et al. |
| 6,118,287 A | 9/2000 | Boll et al. | | 6,362,792 B1 | 3/2002 | Sawamura et al. |
| 6,118,894 A | 9/2000 | Schwartz et al. | | 6,366,247 B1 | 4/2002 | Sawamura et al. |
| 6,121,783 A | 9/2000 | Horner et al. | | 6,369,776 B1 | 4/2002 | Leisten et al. |
| 6,124,723 A | 9/2000 | Costello | | 6,376,258 B2 | 4/2002 | Hefti |
| 6,124,725 A | 9/2000 | Sato | | 6,380,751 B2 | 4/2002 | Harwood et al. |
| 6,127,831 A | 10/2000 | Khoury et al. | | 6,384,614 B1 | 5/2002 | Hager et al. |
| 6,130,544 A | 10/2000 | Strid et al. | | 6,395,480 B1 | 5/2002 | Hefti |
| 6,137,302 A | 10/2000 | Schwindt | | 6,396,296 B1 | 5/2002 | Tarter et al. |
| 6,137,303 A | 10/2000 | Deckert et al. | | 6,396,298 B1 | 5/2002 | Young et al. |
| 6,144,212 A | 11/2000 | Mizuta | | 6,400,168 B2 | 6/2002 | Matsunaga et al. |
| 6,147,502 A | 11/2000 | Fryer et al. | | 6,404,213 B2 | 6/2002 | Noda |
| 6,147,851 A | 11/2000 | Anderson | | 6,407,560 B1 | 6/2002 | Walraven et al. |
| 6,160,407 A | 12/2000 | Nikawa | | 6,407,562 B1 | 6/2002 | Whiteman |
| 6,161,294 A | 12/2000 | Bland et al. | | 6,409,724 B1 | 6/2002 | Penny et al. |
| 6,166,553 A | 12/2000 | Sinsheimer | | 6,414,478 B1 | 7/2002 | Suzuki |
| 6,169,410 B1 | 1/2001 | Grace et al. | | 6,415,858 B1 | 7/2002 | Getchel et al. |
| 6,172,337 B1 | 1/2001 | Johnsgard et al. | | 6,418,009 B1 | 7/2002 | Brunette |
| 6,175,228 B1 | 1/2001 | Zamborelli et al. | | 6,420,722 B2 | 7/2002 | Moore et al. |
| 6,181,144 B1 | 1/2001 | Hembree et al. | | 6,424,141 B1 | 7/2002 | Hollman et al. |
| 6,181,149 B1 | 1/2001 | Godfrey et al. | | 6,424,316 B1 | 7/2002 | Leisten |

| | | |
|---|---|---|
| 6,445,202 B1 | 9/2002 | Cowan et al. |
| 6,447,339 B1 | 9/2002 | Reed et al. |
| 6,448,788 B1 | 9/2002 | Meaney et al. |
| 6,459,739 B1 | 10/2002 | Vitenberg |
| 6,466,046 B1 | 10/2002 | Maruyama et al. |
| 6,468,816 B2 | 10/2002 | Hunter |
| 6,476,442 B1 | 11/2002 | Williams et al. |
| 6,480,013 B1 | 11/2002 | Nayler et al. |
| 6,481,939 B1 | 11/2002 | Gillespie et al. |
| 6,483,327 B1 | 11/2002 | Bruce et al. |
| 6,483,336 B1 | 11/2002 | Harris et al. |
| 6,486,687 B2 | 11/2002 | Harwood et al. |
| 6,488,405 B1 | 12/2002 | Eppes et al. |
| 6,489,789 B2 | 12/2002 | Peters et al. |
| 6,490,471 B2 | 12/2002 | Svenson et al. |
| 6,492,822 B2 | 12/2002 | Schwindt et al. |
| 6,501,289 B1 | 12/2002 | Takekoshi |
| 6,512,391 B2 | 1/2003 | Cowan et al. |
| 6,512,482 B1 | 1/2003 | Nelson et al. |
| 6,515,494 B1 | 2/2003 | Low |
| 6,528,993 B1 | 3/2003 | Shin et al. |
| 6,529,844 B1 | 3/2003 | Kapetanic et al. |
| 6,548,311 B1 | 4/2003 | Knoll |
| 6,549,022 B1 | 4/2003 | Cole, Jr. et al. |
| 6,549,026 B1 | 4/2003 | DiBattista et al. |
| 6,549,106 B2 | 4/2003 | Martin |
| 6,566,079 B2 | 5/2003 | Hefti |
| 6,573,702 B2 | 6/2003 | Marcuse et al. |
| 6,578,264 B1 | 6/2003 | Gleason et al. |
| 6,580,283 B1 | 6/2003 | Carbone et al. |
| 6,582,979 B2 | 6/2003 | Coccioli et al. |
| 6,587,327 B1 | 7/2003 | Devoe et al. |
| 6,603,322 B1 | 8/2003 | Boll et al. |
| 6,605,951 B1 | 8/2003 | Cowan |
| 6,605,955 B1 | 8/2003 | Costello et al. |
| 6,608,494 B1 | 8/2003 | Bruce et al. |
| 6,608,496 B1 | 8/2003 | Strid et al. |
| 6,611,417 B2 | 8/2003 | Chen |
| 6,617,862 B1 | 9/2003 | Bruce |
| 6,621,082 B2 | 9/2003 | Morita et al. |
| 6,624,891 B2 | 9/2003 | Marcus et al. |
| 6,627,461 B2 | 9/2003 | Chapman et al. |
| 6,628,503 B2 | 9/2003 | Sogard |
| 6,628,980 B2 | 9/2003 | Atalar et al. |
| 6,633,174 B1 | 10/2003 | Satya et al. |
| 6,636,059 B2 | 10/2003 | Harwood et al. |
| 6,636,182 B2 | 10/2003 | Mehltretter |
| 6,639,415 B2 | 10/2003 | Peters et al. |
| 6,639,461 B1 | 10/2003 | Tam et al. |
| 6,642,732 B2 | 11/2003 | Cowan et al. |
| 6,643,597 B1 | 11/2003 | Dunsmore |
| 6,650,135 B1 | 11/2003 | Mautz et al. |
| 6,653,903 B2 | 11/2003 | Leich et al. |
| 6,657,214 B1 | 12/2003 | Foegelle et al. |
| 6,657,601 B2 | 12/2003 | McLean |
| 6,686,753 B1 | 2/2004 | Kitahata |
| 6,701,265 B2 | 3/2004 | Hill et al. |
| 6,707,548 B2 | 3/2004 | Kreimer et al. |
| 6,710,798 B1 | 3/2004 | Hershel et al. |
| 6,717,426 B2 | 4/2004 | Iwasaki |
| 6,720,782 B2 | 4/2004 | Schwindt et al. |
| 6,724,205 B1 | 4/2004 | Hayden et al. |
| 6,724,928 B1 | 4/2004 | Davis |
| 6,727,716 B1 | 4/2004 | Sharif |
| 6,731,804 B1 | 5/2004 | Carrieri et al. |
| 6,734,687 B1 | 5/2004 | Ishitani et al. |
| 6,737,920 B2 | 5/2004 | Jen et al. |
| 6,739,208 B2 | 5/2004 | Hyakudomi |
| 6,744,268 B2 | 6/2004 | Hollman |
| 6,753,679 B1 | 6/2004 | Kwong et al. |
| 6,753,699 B2 | 6/2004 | Stockstad |
| 6,756,751 B2 | 6/2004 | Hunter |
| 6,768,328 B2 | 7/2004 | Self et al. |
| 6,770,955 B1 | 8/2004 | Coccioli et al. |
| 6,771,090 B2 | 8/2004 | Harris et al. |
| 6,771,806 B1 | 8/2004 | Satya et al. |
| 6,774,651 B1 | 8/2004 | Hembree |
| 6,777,964 B2 | 8/2004 | Navratil et al. |
| 6,778,140 B1 | 8/2004 | Yeh |
| 6,784,679 B2 | 8/2004 | Sweet et al. |
| 6,788,093 B2 | 9/2004 | Aitren et al. |
| 6,791,344 B2 | 9/2004 | Cook et al. |
| 6,794,888 B2 | 9/2004 | Kawaguchi et al. |
| 6,794,950 B2 | 9/2004 | Du Toit et al. |
| 6,798,226 B2 | 9/2004 | Altmann et al. |
| 6,801,047 B2 | 10/2004 | Harwood et al. |
| 6,806,724 B2 | 10/2004 | Hayden et al. |
| 6,806,836 B2 | 10/2004 | Ogawa et al. |
| 6,809,533 B1 | 10/2004 | Anlage et al. |
| 6,812,718 B1 | 11/2004 | Chong et al. |
| 6,822,463 B1 | 11/2004 | Jacobs |
| 6,836,135 B2 | 12/2004 | Harris et al. |
| 6,838,885 B2 | 1/2005 | Kamitani |
| 6,842,024 B2 | 1/2005 | Peters et al. |
| 6,843,024 B2 | 1/2005 | Nozaki et al. |
| 6,847,219 B1 | 1/2005 | Lesher et al. |
| 6,856,129 B2 | 2/2005 | Thomas et al. |
| 6,861,856 B2 | 3/2005 | Dunklee et al. |
| 6,864,694 B2 | 3/2005 | McTigue |
| 6,873,167 B2 | 3/2005 | Goto et al. |
| 6,885,197 B2 | 4/2005 | Harris et al. |
| 6,900,646 B2 | 5/2005 | Kasukabe et al. |
| 6,900,647 B2 | 5/2005 | Yoshida et al. |
| 6,900,652 B2 | 5/2005 | Mazur |
| 6,900,653 B2 | 5/2005 | Yu et al. |
| 6,902,941 B2 | 6/2005 | Sun |
| 6,903,563 B2 | 6/2005 | Yoshida et al. |
| 6,914,244 B2 | 7/2005 | Alani |
| 6,914,580 B2 | 7/2005 | Leisten |
| 6,924,656 B2 | 8/2005 | Matsumoto |
| 6,927,079 B1 | 8/2005 | Fyfield |
| 6,937,341 B1 | 8/2005 | Woollam et al. |
| 6,965,226 B2 | 11/2005 | Dunklee |
| 6,970,001 B2 | 11/2005 | Chheda et al. |
| 6,987,483 B2 | 1/2006 | Tran |
| 7,001,785 B1 | 2/2006 | Chen |
| 7,002,133 B2 | 2/2006 | Beausoleil et al. |
| 7,002,363 B2 | 2/2006 | Mathieu |
| 7,002,364 B2 | 2/2006 | Kang et al. |
| 7,003,184 B2 | 2/2006 | Ronnekleiv et al. |
| 7,005,842 B2 | 2/2006 | Fink et al. |
| 7,005,868 B2 | 2/2006 | McTigue |
| 7,005,879 B1 | 2/2006 | Robertazzi |
| 7,006,046 B2 | 2/2006 | Aisenbrey |
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |
| 7,012,441 B2 | 3/2006 | Chou et al. |
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,019,701 B2 | 3/2006 | Ohno et al. |
| 7,020,360 B2 | 3/2006 | Satomura et al. |

| | | | | | | |
|---|---|---|---|---|---|---|
| 7,020,363 B2 | 3/2006 | Johannessen | | 2003/0139790 A1 | 7/2003 | Ingle et al. |
| 7,022,976 B1 | 4/2006 | Santana, Jr. et al. | | 2003/0141861 A1 | 7/2003 | Navratil et al. |
| 7,022,985 B2 | 4/2006 | Knebel et al. | | 2003/0155939 A1 | 8/2003 | Lutz et al. |
| 7,023,225 B2 | 4/2006 | Blackwood | | 2003/0156270 A1 | 8/2003 | Hunter |
| 7,023,226 B2 | 4/2006 | Okumura et al. | | 2003/0170898 A1 | 9/2003 | Gunderson et al. |
| 7,023,229 B2 | 4/2006 | Maesaki et al. | | 2003/0184332 A1 | 10/2003 | Tomimatsu et al. |
| 7,023,231 B2 | 4/2006 | Howland, Jr. et al. | | 2004/0015060 A1 | 1/2004 | Samsoondar et al. |
| 7,025,628 B2 | 4/2006 | LaMeres et al. | | 2004/0021475 A1 | 2/2004 | Ito et al. |
| 7,026,832 B2 | 4/2006 | Chaya et al. | | 2004/0061514 A1 | 4/2004 | Schwindt et al. |
| 7,026,833 B2 | 4/2006 | Rincon et al. | | 2004/0066181 A1 | 4/2004 | Thies |
| 7,026,834 B2 | 4/2006 | Hwang | | 2004/0069776 A1 | 4/2004 | Fagrell et al. |
| 7,026,835 B2 | 4/2006 | Farnworth et al. | | 2004/0090223 A1 | 5/2004 | Yonezawa |
| 7,030,599 B2 | 4/2006 | Douglas | | 2004/0095145 A1 | 5/2004 | Boudiaf et al. |
| 7,030,827 B2 | 4/2006 | Mahler et al. | | 2004/0095641 A1 | 5/2004 | Russum et al. |
| 7,032,307 B2 | 4/2006 | Matsunaga et al. | | 2004/0100276 A1 | 5/2004 | Fanton |
| 7,034,553 B2 | 4/2006 | Gilboe | | 2004/0100297 A1 | 5/2004 | Tanioka et al. |
| 7,035,738 B2 | 4/2006 | Matsumoto et al. | | 2004/0108847 A1 | 6/2004 | Stoll et al. |
| 7,088,981 B2 | 8/2006 | Chang | | 2004/0113639 A1 | 6/2004 | Dunklee et al. |
| 7,096,133 B1 | 8/2006 | Martin et al. | | 2004/0113640 A1 | 6/2004 | Cooper et al. |
| 7,101,797 B2 | 9/2006 | Yuasa | | 2004/0130787 A1 | 7/2004 | Thome-Forster et al. |
| 7,138,813 B2 | 11/2006 | Cowan et al. | | 2004/0132222 A1 | 7/2004 | Hembree et al. |
| 7,187,188 B2 | 3/2007 | Andrews et al. | | 2004/0134899 A1 | 7/2004 | Hiramatsu et al. |
| 7,188,037 B2 | 3/2007 | Hidehira | | 2004/0147034 A1 | 7/2004 | Gore et al. |
| 7,221,172 B2 | 5/2007 | Dunklee | | 2004/0162689 A1 | 8/2004 | Jamneala et al. |
| 7,250,779 B2 | 7/2007 | Dunklee et al. | | 2004/0175294 A1 | 9/2004 | Ellison et al. |
| 7,352,168 B2 | 4/2008 | Dunklee | | 2004/0186382 A1 | 9/2004 | Modell et al. |
| 7,362,115 B2 | 4/2008 | Andrews et al. | | 2004/0193382 A1 | 9/2004 | Adamian et al. |
| 7,423,419 B2 | 9/2008 | Dunklee | | 2004/0197771 A1 | 10/2004 | Powers et al. |
| 7,501,810 B2 | 3/2009 | Dunklee | | 2004/0199350 A1 | 10/2004 | Blackham et al. |
| 7,514,915 B2 | 4/2009 | Dunklee | | 2004/0207072 A1 | 10/2004 | Hiramatsu et al. |
| 7,518,358 B2 | 4/2009 | Dunklee | | 2004/0207424 A1 | 10/2004 | Hollman |
| 2001/0002794 A1 | 6/2001 | Draving et al. | | 2004/0239338 A1 | 12/2004 | Jonsson et al. |
| 2001/0009377 A1 | 7/2001 | Schwindt et al. | | 2004/0246004 A1 | 12/2004 | Heuermann |
| 2001/0010468 A1 | 8/2001 | Gleason et al. | | 2004/0251922 A1 | 12/2004 | Martens et al. |
| 2001/0020283 A1 | 9/2001 | Sakaguchi | | 2004/0267691 A1 | 12/2004 | Vasudeva |
| 2001/0024116 A1 | 9/2001 | Draving | | 2005/0024069 A1 | 2/2005 | Hayden et al. |
| 2001/0030549 A1 | 10/2001 | Gleason et al. | | 2005/0026276 A1 | 2/2005 | Chou |
| 2001/0043073 A1 | 11/2001 | Montoya | | 2005/0030047 A1 | 2/2005 | Adamian |
| 2001/0044152 A1 | 11/2001 | Burnett | | 2005/0054029 A1 | 3/2005 | Tomimatsu et al. |
| 2001/0045511 A1 | 11/2001 | Moore et al. | | 2005/0062533 A1 | 3/2005 | Vice |
| 2001/0054906 A1 | 12/2001 | Fujimura | | 2005/0083130 A1 | 4/2005 | Grilo |
| 2002/0005728 A1 | 1/2002 | Babson et al. | | 2005/0099192 A1 | 5/2005 | Dunklee et al. |
| 2002/0008533 A1 | 1/2002 | Ito et al. | | 2005/0101846 A1 | 5/2005 | Fine et al. |
| 2002/0009377 A1 | 1/2002 | Shafer | | 2005/0156675 A1 | 7/2005 | Rohde et al. |
| 2002/0009378 A1 | 1/2002 | Obara | | 2005/0164160 A1 | 7/2005 | Gunter et al. |
| 2002/0011859 A1 | 1/2002 | Smith et al. | | 2005/0165316 A1 | 7/2005 | Lowery et al. |
| 2002/0011863 A1 | 1/2002 | Takahashi et al. | | 2005/0168722 A1 | 8/2005 | Forstner et al. |
| 2002/0050828 A1 | 5/2002 | Seward, IV et al. | | 2005/0174191 A1 | 8/2005 | Brunker et al. |
| 2002/0066551 A1 | 6/2002 | Stone et al. | | 2005/0178980 A1 | 8/2005 | Skidmore et al. |
| 2002/0070743 A1 | 6/2002 | Felici et al. | | 2005/0195124 A1 | 9/2005 | Puente Baliarda et al. |
| 2002/0070745 A1 | 6/2002 | Johnson et al. | | 2005/0227503 A1 | 10/2005 | Reitinger |
| 2002/0075027 A1 | 6/2002 | Hollman et al. | | 2005/0236587 A1 | 10/2005 | Kodama et al. |
| 2002/0079911 A1 | 6/2002 | Schwindt | | 2005/0237102 A1 | 10/2005 | Tanaka |
| 2002/0118009 A1 | 8/2002 | Hollman et al. | | 2006/0052075 A1 | 3/2006 | Galivanche et al. |
| 2002/0118034 A1 | 8/2002 | Laureanti | | 2006/0114012 A1 | 6/2006 | Reitinger |
| 2002/0149377 A1 | 10/2002 | Hefti et al. | | 2006/0155270 A1 | 7/2006 | Hancock et al. |
| 2002/0153909 A1 | 10/2002 | Petersen et al. | | 2006/0158207 A1 | 7/2006 | Reitinger |
| 2002/0163769 A1 | 11/2002 | Brown | | 2006/0226864 A1 | 10/2006 | Kramer |
| 2002/0168659 A1 | 11/2002 | Hefti et al. | | 2007/0024506 A1 | 2/2007 | Hardacker |
| 2002/0180466 A1 | 12/2002 | Hiramatsu et al. | | 2007/0030021 A1 | 2/2007 | Cowan et al. |
| 2002/0197709 A1 | 12/2002 | Van der Weide et al. | | | | |
| 2003/0010877 A1 | 1/2003 | Landreville et al. | | FOREIGN PATENT DOCUMENTS | | |
| 2003/0030822 A1 | 2/2003 | Finarov | | | | |
| 2003/0032000 A1 | 2/2003 | Liu et al. | | DE | 29 12 826 | 10/1980 |
| 2003/0040004 A1 | 2/2003 | Hefti et al. | | DE | 31 14 466 | 3/1982 |
| 2003/0057513 A1 | 4/2003 | Alexander | | DE | 31 25 552 | 11/1982 |
| 2003/0062915 A1 | 4/2003 | Arnold et al. | | DE | 3637549 | 5/1988 |
| 2003/0071631 A1 | 4/2003 | Alexander | | DE | 41 09 908 | 10/1992 |
| 2003/0072549 A1 | 4/2003 | Facer et al. | | DE | 43 16 111 | 11/1994 |
| 2003/0077649 A1 | 4/2003 | Cho et al. | | DE | 94 06 227 | 10/1995 |
| 2003/0088180 A1 | 5/2003 | VanVeen et al. | | DE | 195 41 334 | 9/1996 |
| 2003/0119057 A1 | 6/2003 | Gascoyne et al. | | DE | 196 16 212 | 10/1996 |
| 2003/0139662 A1 | 7/2003 | Seidman | | DE | 19522774 | 1/1997 |

| | | |
|---|---|---|
| DE | 196 18 717 | 1/1998 |
| DE | 288 234 | 3/1999 |
| DE | 693 22 206 | 4/1999 |
| DE | 10000324 | 7/2001 |
| EP | 0 087 497 | 9/1983 |
| EP | 0 201 205 | 12/1986 |
| EP | 0 314 481 | 5/1989 |
| EP | 0 333 521 | 9/1989 |
| EP | 0 460 911 | 12/1991 |
| EP | 0 574 149 A1 | 5/1993 |
| EP | 0 574 149 | 12/1993 |
| EP | 0 706 210 | 4/1996 |
| EP | 0 505 981 | 6/1998 |
| EP | 0 573 183 | 1/1999 |
| EP | 0 945 736 | 9/1999 |
| GB | 2 197 081 | 5/1988 |
| JP | 53-037077 | 4/1978 |
| JP | 53-052354 | 5/1978 |
| JP | 55-115383 | 9/1980 |
| JP | 56-007439 | 1/1981 |
| JP | 56-88333 | 7/1981 |
| JP | 57-075480 | 5/1982 |
| JP | 57-163035 | 10/1982 |
| JP | 62-011243 | 1/1987 |
| JP | 62-11243 | 1/1987 |
| JP | 62-51235 | 3/1987 |
| JP | 62-098634 | 5/1987 |
| JP | 62-107937 | 5/1987 |
| JP | 62-239050 | 10/1987 |
| JP | 63-108736 | 5/1988 |
| JP | 63-129640 | 6/1988 |
| JP | 63-143814 | 6/1988 |
| JP | 63-160355 | 7/1988 |
| JP | 63-318745 | 12/1988 |
| JP | 1-165968 | 6/1989 |
| JP | 1-178872 | 7/1989 |
| JP | 1-209380 | 8/1989 |
| JP | 1-214038 | 8/1989 |
| JP | 1-219575 | 9/1989 |
| JP | 1-296167 | 11/1989 |
| JP | 2-22836 | 1/1990 |
| JP | 2-22837 | 1/1990 |
| JP | 2-22873 | 1/1990 |
| JP | 2-124469 | 5/1990 |
| JP | 2-191352 | 7/1990 |
| JP | 2-220453 | 9/1990 |
| JP | 3-67187 | 3/1991 |
| JP | 3-175367 | 7/1991 |
| JP | 3-196206 | 8/1991 |
| JP | 3-228348 | 10/1991 |
| JP | 4-732 | 1/1992 |
| JP | 4-130639 | 5/1992 |
| JP | 4-159043 | 6/1992 |
| JP | 4-206930 | 7/1992 |
| JP | 4-340248 | 11/1992 |
| JP | 5-8476 | 2/1993 |
| JP | 5-082631 | 4/1993 |
| JP | 5-157790 | 6/1993 |
| JP | 51-57790 | 6/1993 |
| JP | 5-166893 | 7/1993 |
| JP | 51-66893 | 7/1993 |
| JP | 6-85044 | 3/1994 |
| JP | 60-71425 | 3/1994 |
| JP | 6-102313 | 4/1994 |
| JP | 6-132709 | 5/1994 |
| JP | 7-005078 | 1/1995 |
| JP | 7-5197 | 1/1995 |
| JP | 7-12871 | 1/1995 |
| JP | 7005078 | 1/1995 |
| JP | 7-84003 | 3/1995 |
| JP | 7-273509 | 10/1995 |
| JP | 8-35987 | 2/1996 |
| JP | 8-261898 | 10/1996 |
| JP | 8-330401 | 12/1996 |
| JP | 10-116866 | 5/1998 |
| JP | 10-339743 | 12/1998 |
| JP | 11-023975 | 1/1999 |
| JP | 11-031724 | 2/1999 |
| JP | 2000-329664 | 11/2000 |
| JP | 2001-124676 | 5/2001 |
| JP | 2001-189285 | 7/2001 |
| JP | 2001-189378 | 7/2001 |
| JP | 2001-358184 | 12/2001 |
| JP | 2002033374 | 1/2002 |
| JP | 2002-164396 | 6/2002 |
| JP | 2002/164396 | 6/2002 |
| JP | 2002-203879 | 7/2002 |
| JP | 2002-243502 | 8/2002 |
| SU | 843040 | 6/1981 |
| SU | 1392603 | 4/1988 |
| WO | WO 80/00101 | 1/1980 |
| WO | WO 86/07493 | 12/1986 |
| WO | WO 89/04001 | 5/1989 |
| WO | WO 01/69656 | 9/2001 |
| WO | WO 2004/049395 | 6/2004 |
| WO | WO 2004/065944 | 8/2004 |
| WO | WO 2004/079299 | 9/2004 |
| WO | WO 2005/062025 | 7/2005 |

OTHER PUBLICATIONS

John A. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.

Cascade Microtech, "Introducing the peak of analytical probe stations," MicroProbe Update, May 1990.

H.-J. Eul and B. Schiek, "Thru-Match-Reflect: One Result of a Rigorous Theory for De-Embedding and Network Analyzer Calibration," 18$^{th}$ Euopean Microwave Conference '88, The International Conference Designed for the Microwave Community, Published by Microwave Exhibitions and Publishers Limited, Sep. 12-16, 1988, Stockholm, Sweden.

Cascade Microtech, "Analytical Probe Station," Summit 9000 Series, Jun. 1, 1990.

Maury Microwave Corporation, "MT950D Series, Transistor Test Fixture Software, Software Application Packs," Sep. 20, 1982.

Eric Phizicky, Philippe I.H. Bastiaens, Heng Zhu, Michael Snyder, & Stanley Fields, "Protein analysis on a proteomic scale," Nature 422, insight: review article, Mar. 13, 2003.

Brian J. Clifton, "Precision slotted-Line Impedance Measurements Using computer Simulation for Data Correction," IEEE Transactions on Instrumentation and Measurement, vol. IM-19, No. 4, Nov. 1970, pp. 358-363.

Eric Strid (Cascade Microtech), "Planar Impedance Standards and Accuracy Considerations in Vector Network Analysis," Jun. 1986, 8 pages.

Maury Microwave Corporation, "MT950 Series Transistor Test Fixture (TTF) Notice! Notice! Notice!," May 31, 1985.

Maury Microwave Corporation, MT950 Series Transistor Test Fixture (TTF), Oct. 7, 1982, 4 pages.

Design Technique, "Microstrip Microwave Test Fixture," May 1986, 2 pages.

Micromanipulator Sales and Services Inc., "Test Station Accessories," Copyright 1983, 1984, 1 page.

Ruedi Aebersold & Matthias Mann, "Insight Review Articles, Mass spectrometry-based proteomics," Nature, vol. 422, Mar. 13, 2003, pp. 198-207.

Keithley Instruments, Inc. "Low-Level Measurements for Effective Low Current, Low Voltage, and High Impedance Measurements," Revised Third Edition, Printed Jun. 1984.

Hewlett Packard, "HP 4284A Precision LCR Meter Operation Manual (Including Option 001,002,006,201,202,301)," Third Edition, Dec. 1991, pp. 2-1,6-9, 6-15.

Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.

Cascade Microtech Technical Brief, A Guide to Better Vector Network Analyzer Calibrations for Probe-Tip Measurements, Copyright 1994, 2 pages.

Temptronic, "Guarded" Chuck Sketch, Nov. 15, 1989.

Andrej Sali, Robert Glaeser, Thomas Earnest & Wolfgang Baumeister, "From words to literature in structural proteomics," Insight: Review Article, Nature 422, pp. 216-225, Mar. 13, 2003.

Mike Tyers & Matthias Mann, "From genomics to proteomics," Insight overview, Nature vol. 422 Mar. 2003, pp. 193-197.

William Knauer, "Fixturing for Low-Current/Low-Voltage Parametric Testing," Evaluation Engineering, Nov. 1990, pp. 9-12.

J.D. Tompkins, "Evaluating High Speed AC Testers," IBM Technical Disclosure Bulletin, vol. 13, No. 7 Dec. 1970, p. 180.

Jim Fitzpatrick, "Error Models for Systems Measurement," Microwave Journal, May 1978, pp. 63-66.

Sam Hanash, "Disease proteomics," Insight Review Articles, Nature, vol. 422, Mar. 13, 2003, pp. 226-232.

Design Technique International, "Adjustable Test Fixture," Copyright 1988.

Ronald F. Bauer & Paul Penfield, Jr.,"De-Embedding and Unterminating," IEEE Transactions on Microwave Theory and Techniques, vol. MTT-22, No. 3, Mar. 1974, pp. 282-288.

Cross Section—Signatone S-1240 Sketch, Advertised & Sold 1987-1988.

Yousuke Yamamoto, "A Compact Self-Shielding Prober for Accurate Measurement of On-Wafer Electron Devices," IEEE Transactions on Instrumentation and Measurement, vol. 38, No. 6, Dec. 1989, pp. 1088-1093.

R. Y. Koyama & M. G. Buehler, " Semiconductor Measurement Technology: A Wafer Chuck for Use Between—196 and 350° C," U.S. Department of Commerce, National Technical Information Service, PB-293 298, Issued Jan. 1979.

Ken Cole, "ThermoChuck Performance (Fax)," 2 pages, Mar. 10, 1995.

S. Beck & E. Tomann, "Chip Tester," IBM Technical Disclosure Bulletin, Jan. 1985.

L. L. Sohn, O. A. Saleh, G. R. Facer, A. J. Beavis, R. S. Allan, & D. A. Notterman, "Capacitance Cytometry: Measuring biological cells one by one," PNAS vol. 97, No. 20 Sep. 26, 2000, pp. 10687-10690.

Mark S. Boguski & Martin W. McIntosh, "Biomedical informatics for proteomics," Insight: review article, Nature 422, Mar. 13, 2003, pp. 233-237.

Microwave Products, Microwave Journal, Sep. 1988, 1 page.

Hewlett Packard, "HP 4142B Modular DC source/Monitor Practical Applications-High Speed DC Characterization of Semiconductor Devices from Sub pA to 1A," Nov. 1987, pp. 1-4.

Flexion Corporation, "Cryotest Station MP-3," Cascade Microtech, Inc. vs. Micromanipulator Company, Inc., Applebay Exhibit 576, May 13, 1998, 68 pages.

Flexion Corporation, "Cryotest Station MP-3," Cascade Microtech, Inc. vs. Micromanipulator Company, Inc., Applebay Exhibit 578, May 13, 1998, 1 page.

Cascade Microtech, Inc. vs. Micromanipulator Company, Inc., Applebay Exhibit 572, May 13, 1998, 2 pages.

Cascade Microtech, Inc. vs. Micromanipulator Company, Inc., Applebay Exhibits 581A, 581B, and 581C, May 13, 1998, 3 pages.

Flexion Corporation, "AP-1 Cryotest Station," Applebay Exhibit 582, May 13, 1998, 20 pages.

Flexion Corporation, "AP-1 Cryotest Station User Manual," Applebay Exhibit 583, May 13, 1998, 187 pages.

Cascade Microtech, Inc. vs. Micromanipulator Company, Inc., Applebay Exhibits 577A, 577B, 577C, May 13, 1998, 3 pages.

Cascade Microtech, Inc. vs. Micromanipulator Company, Inc., Applebay Exhibit 585, May 13, 1998, 7 pages.

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Ruedi Aebersold and Matthias Mann, "insight review articles. Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Wavequide-to-Microstrip Transition With Integrated Bias-T," IEEE Microwave and Wireless Components Letters, vol. 13, No. 7, Jul. 2003, pp. 262-264.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions On Microwave Theory and Techniques, vol. 46, No. 5, May 1998, pp. 536-542.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Insitute of Physics, pp. 1354-1356.

\* cited by examiner

GUARDED TUB ENCLOSURE

CROSS-REFERENCE TO PREVIOUS APPLICATIONS

This application is a continuation of U.S. patent application Ser. No. 11/035,543, filed Jan. 14, 2005, now U.S. Pat. No. 7,221,146; which is a continuation of and claims priority to U.S. patent application Ser. No. 10/319,287, filed Dec. 13, 2002, now U.S. Pat. No. 6,861,856.

BACKGROUND OF THE INVENTION

The present invention relates to a guarding structure for a probe station.

Probe stations are designed to measure the characteristics of electrical devices such as silicon wafers. Probe stations typically include a chuck that supports the electrical device while it is being probed by needles or contacts on a membrane situated above the chuck. In order to provide a controlled environment to probe the electrical device, many of today's probe stations surround the chuck with an environmental enclosure so that temperature, humidity, etc. may be held within predetermined limits during testing. Environmental enclosures protect the device from spurious air currents that would otherwise affect measurements, and also facilitate thermal testing of electrical devices at other-than-ambient environmental conditions. Environmental conditions within the enclosure are principally controlled by a dry air ventilation system as well as a temperature element, usually located below the chuck that heats or cools the electrical device being tested through thermal conduction.

Many probe stations also incorporate guarding and electromagnetic interference (EMI) shielding structures within or around the environmental enclosures in order to provide an electrically quiet environment, often essential during high frequency testing where electrical noise from external electromagnetic sources can hinder accurate measurement of the electrical device's characteristics. Guarding and EMI shielding structures are well known and discussed extensively in technical literature. See, for example, an article by William Knauer entitled "Fixturing for Low Current/Low Voltage Parametric Testing" appearing in *Evaluation Engineering*, November, 1990, pages 150-153.

Probe stations incorporating EMI shielding structures will usually at least partially surround the test signal with a guard signal that closely approximates the test signal, thus inhibiting electromagnetic current leakage from the test signal path to its immediately surrounding environment. Similarly, EMI shielding structures may include interconnecting a shield potential to the environmental enclosure surrounding much of the perimeter of the probe station. The environmental enclosure is typically connected to earth ground, instrumentation ground, or some other desired potential.

To provide guarding and shielding for systems of the type just described, existing probe stations may include a multistage chuck upon which the electrical device rests when being tested. The top stage of the chuck, which supports the electrical device, typically comprises a solid, electrically conductive metal plate through which the test signal may be routed. A middle stage and a bottom stage of the chuck similarly comprise solid electrically conductive plates through which a guard signal and a shield signal may be routed, respectively. In this fashion, an electrical device resting on such a multi-stage chuck may be both guarded and shielded from below.

FIG. 1 shows a generalized schematic of an existing probe station. A probe station 10 includes a chuck 12 that supports an electrical device 14 to be probed by a probe apparatus 16 supported by a platen 18 located above the chuck 12. The chuck is fixedly and/or rigidly interconnected with a tub enclosure 20. The enclosure 20 may be conductive and electrically connected to a guard signal, shield signal, ground signal, or floating. The tub enclosure 20 at least partially surrounds the chuck 12, and hence the electrical device 14.

Multiple electrical devices contained on a silicon wafer may be successively positioned below the probe apparatus 16 for testing by moving the combination of the tub enclosure 20 and chuck 12 laterally. A positioner 22, typically located below the tub enclosure 20, may provide vertical, lateral, and/or angular adjustments of the chuck 12. Because the chuck 12 does not move laterally with respect to the tub enclosure 20, the size of the tub enclosure 20 may closely surround the chuck 12, facilitating efficient control of the environment immediately surrounding the chuck 12.

FIG. 2 shows a generalized schematic of another probe station 11. Referring to FIG. 2, where numerals common with FIG. 1 represent similar elements that perform similar functions, the probe station 11 includes the chuck 12 that supports the electrical device 14 to be probed by the probe apparatus 16 that extends through an opening in the platen 18. Rather than enclosing the chuck 12 in the tub enclosure 20, an outer shield box 24 provides sufficient space for the chuck 12 to be moved laterally by the positioner 22. Because the chuck 12 may freely move within the outer shield box 24, a suspended member 26 electrically interconnected to a guard potential may be readily positioned above the chuck 12. The suspended guard member 26 defines an opening that is aligned with the opening defined by the platen 18 so that the probe apparatus 16 may extend through the guard member 26 to probe the electrical device 14. When connected to a guard signal substantially identical to the test signal provided to the probe apparatus 16, the suspended guard member 26 provides additional guarding for low noise tests. Such a design is exemplified by EP 0 505 981 B1, incorporated by reference herein.

To provide a substantially closed environment, the outer shield box 24 includes a sliding plate assembly 28 that defines a portion of the lower perimeter of the shield box 24. The sliding plate assembly 28 comprises a number of overlapping plate members. Each plate member defines a central opening 30 through which the positioner 22 may extend. Each successively higher plate member is smaller in size and also defines a smaller opening 30 through which the positioner 22 extends. As shown in FIG. 2, the sliding plate assembly 28 is included to permit lateral movement of the positioner 22, and hence the chuck 12, while maintaining a substantially closed lower perimeter for the shield box 24.

One drawback of the probe station 11 depicted in FIG. 2 is that the large space enclosed by the outer shield box 24 results in some difficulty in efficient maintenance of a controlled environment within the outer shield box 24. Not only does more heat have to provided to or removed from the outer shield box 24 when testing an electrical device across a range of temperatures, but dry air ventilation must be provided to the shield box 24 in large quantities. The air currents generated by such a ventilation system may sometimes interfere with accurate measurements taken by the probe station 11.

What is desired, then, is a probe station that provides a quiet electrical environment surrounding the chuck and may readily maintain a controlled environment.

DETAILED DESCRIPTION OF THE PREFERRED EMBODIMENT

Figure 1:
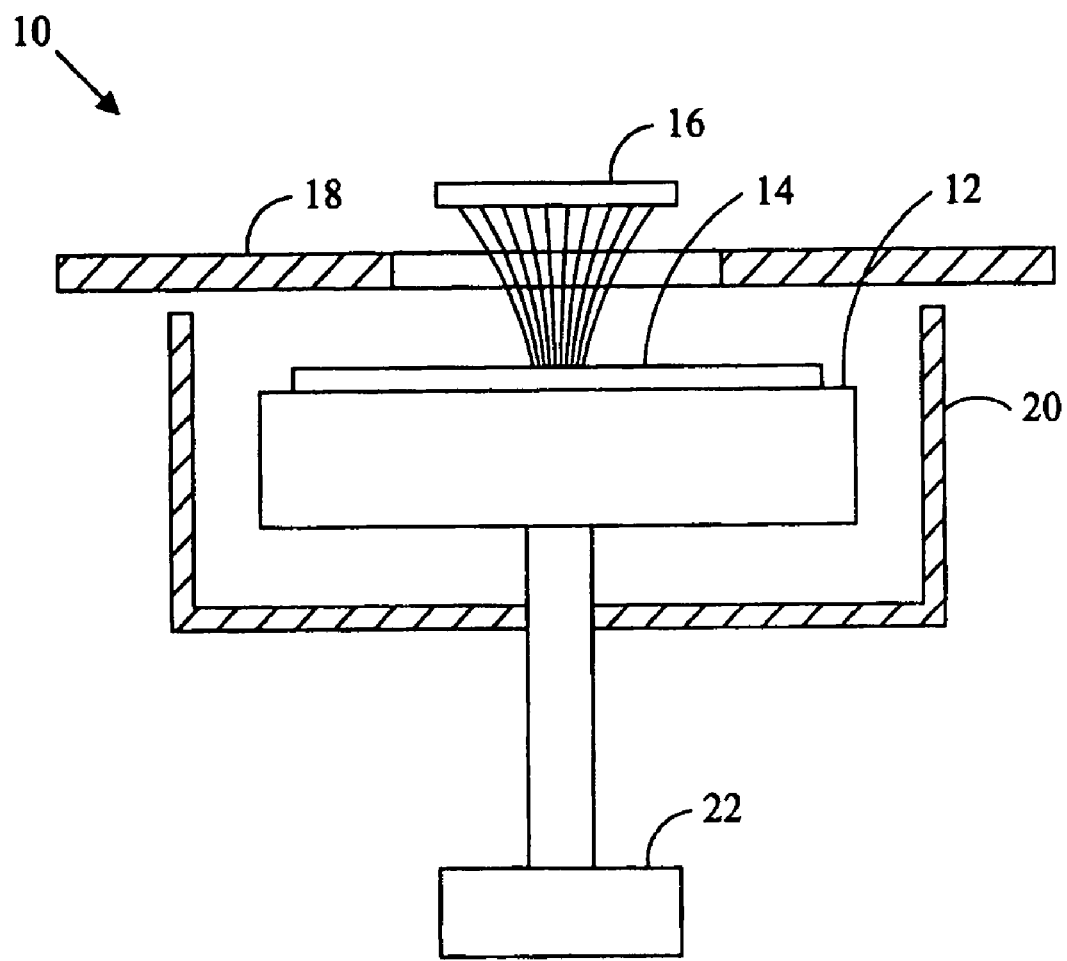
FIG. 1 shows a cross sectional view of an existing probe station that includes a tub enclosure.

Referring again to FIG. 1, the probe station 10 having a chuck 12 that does not laterally move with respect to the tub enclosure 20 permits a small region immediately surrounding the chuck 12 to be enclosed. During testing the chuck 12 and enclosure 20 are moved laterally relative to the probes 16. The relatively small environment of the enclosure 20 facilitates efficient management of the environment within the enclosed region. The tub enclosure 20 defines an upper opening typically at least as large as the wafer including the electrical devices to be tested so that each electrical device may be successively positioned beneath the probing apparatus 16 by lateral movement of the chuck 12 and tub enclosure 20.

Figure 2:
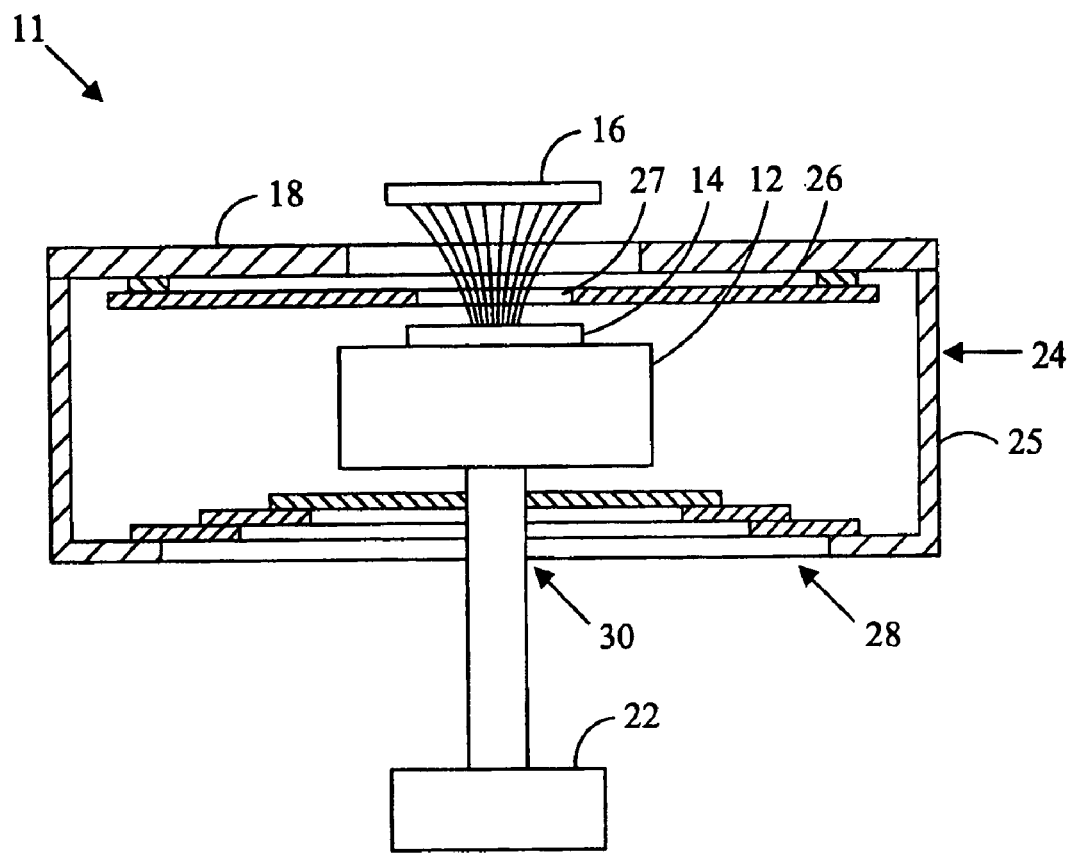
FIG. 2 shows a cross sectional view of an existing probe station that includes an outer shield box.

Referring to FIG. 2, the inclusion of a conductive member electrically connected to a guard potential vertically spaced above the chuck 12 of the probe station 10 provides for a quiet electrical environment surrounding the chuck 12, as exemplified in U.S. Pat. Nos. 5,266,889 and 5,345,120. However, the present inventors determined that the inclusion of a guard member 26 as shown in FIG. 2, into the structure shown in FIG. 1, would result in significant condensation in the wafer 14 region when testing the device under test at different ambient conditions, especially at cold temperatures. The condensation primarily results from movement of the enclosure 20 relative to such a guard member 26 with condensation thereon which is then brought within the environment with the wafer 14 by movement of the enclosure 20. In addition, with a guard member 26 suspended by the platen 118 of FIG. 1, the enclosure 20 can not be raised to form a sealed environment around the chuck 12, which increases electrical noise. The present inventors then came to the realization that by locating a conductive member across the opening of the enclosure 20 that moves together with the enclosure 20 eliminates the condensation resulting from the movement of the enclosure 20 relative to the conductive member and would likewise result in decreasing the noise in the signal by providing an improved guarding environment.

Figure 3:
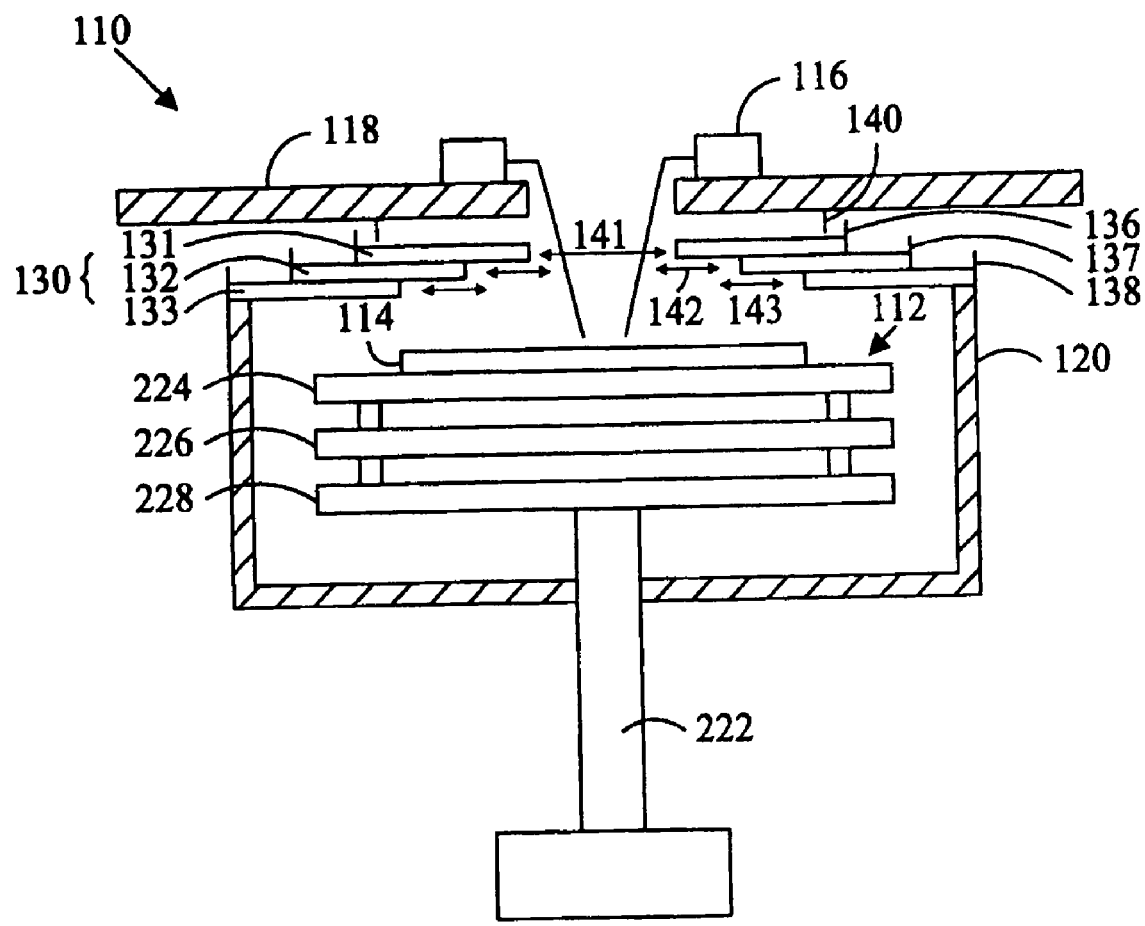
FIG. 3 shows a cross sectional view of a probe station that incorporates the present invention.

FIG. 3 shows a generalized schematic of a modified probe station 110. The probe station 110 includes a chuck 112 that supports an electrical device 114 to be probed by a probe apparatus 116 supported by a platen 118 located above the chuck 112. The platen 118 may be any structure suitable to support probes directly or indirectly. The chuck 112 is preferably fixedly and/or rigidly interconnected with a tub enclosure 120. Similarly, the design may be modified such that the chuck 112 and enclosure 120 have some limited relative movement with respect to one another. However, with such relative movement the enclosure 120 may still require some movement relative to the probes 116 to facilitate testing of an entire wafer approximately the same size as the chuck itself. The enclosure 120 may be non-conductive, or conductive. If the enclosure 120 is conductive it is preferably electrically connected to a guard signal, shield signal, ground signal, or floating. The tub enclosure 120 at least partially surrounds the chuck 112, and hence the electrical device 114. The probe station 110 includes an assembly 130 positioned above a chuck 112. The assembly 130 may be supported by the enclosure 120. The assembly 130 is preferably electrically insulated from the enclosure 120 if both are electrically conductive. The term "above" merely refers to a general direction apart from the chuck 112 and not in reference to "up" and "down" as referenced to the earth. Accordingly, much of the probe station may be "inverted" while still maintaining the "above" relationship. The assembly 130 is preferably conductive and may include a plurality of conductive plates 131, 132, and 133 that are slidably engaged with respect to one another. The conductive plates 131, 132, and 133 each define a respective opening 141, 142, and 143. Each of the conductive plates 131, 132, and 133 may include an upwardly extending circular ring 136, 137, and 138. An insulating ring 140 may be supported by the platen 118. The circular ring 136 is positioned at a location exterior to the insulating ring 140. When the circular ring 136 is preferably moved in a lateral direction it abuts the insulating ring 140 and inhibits further lateral movement in a particular direction of plate 131. At least a part of the opening 141 defined by the conductive plate 131 remains at least partially aligned with the opening defined by the platen 118. In other words, at least part of the opening 141 is spatially overlapping with the opening defined by the platen 118 during probing with the probe 116. Further movement of the enclosure 120 in the same lateral direction results in the circular rings 137 and 138 abutting respective conductive plates 131 and 132. In this manner, the respective openings 142 and 143 defined by the conductive plates 132 and 133 remains at least partially aligned with the opening defined by the platen 118. As it may be observed, the multiple conductive plate assembly 130 permits movement of the enclosure 120 and chuck 112 enclosed therein for probing the device under test 114 while maintaining a guarded conductive member over at least a portion of the device under test 114. The conductive plate assembly 130 may be connected to shield, ground, instrumentation ground, or floating. The conductive plate assembly 130 is also preferably electrically isolated from the enclosure 120 and/or the platen 118.

The central aperture of the assembly 130 maintains an opening that is at least partially overlapping with the opening in the platen. The assembly may, of course, be within the enclosure as opposed to above the enclosure. For example, the size of the opening may be such that it is less than 30%, 20%, or 10% of the size of the opening defined by the upright sides of the enclosure 120. Moreover, the size of the opening may be such that it is less than the size of the wafer 114 being tested, or less than 80%, 60%, or 40% the size of the wafer 114 being tested. Alternatively, the size of the opening may be such that it is less than 50%, 40%, or 30% of the size of the chuck 112 enclosed within the enclosure 120. The size of the opening is selected sufficiently large to permit the probes to be passed through for testing of the wafer thereunder and sufficiently small that the effect of the guarding is sufficiently improved to provide desirable noise levels. As can be seen in FIG. 3, the sliding plate assembly 130 permits lateral movement of the tub enclosure 120 during times when the probe apparatus 116 extends through the sliding plate assembly to probe the device to be tested 114 while nonetheless maintaining a substantially closed region surrounding the chuck 112. The environment in this closed region can therefore be more efficiently controlled.

The probe station 110 depicted in FIG. 3 is also suitable for high frequency, low current measurements. The multistage chuck 112 comprises a top stage 224, a center stage 226, and a lower stage 228, electrically insulated from one another. A positioner 222 extends through the lower periphery of the tub enclosure 120 to support the multistage chuck 112 and provide vertical and angular positioning of the chuck 112 relative to the tub enclosure as well as lateral x- and y-movement of the combination of the chuck 112 and the enclosure 120. The top stage 224 of the chuck 112 supports the electrical device 114 and routes any desired test signal. The center stage 226 of the chuck 112 is capable of routing a guard signal that may preferably approximate the test signal provided to the electrical device 114 and the lower stage 228 of the chuck 112 is capable of routing a shield signal of instrumentation ground or any other desired potential. For high frequency and/or low current measurements where it is desirable to provide additional guarding to eliminate electromagnetic noise, the member 130 is capable of routing the guard signal also provided to the center stage 226 of the chuck 112.

Figure 3A:
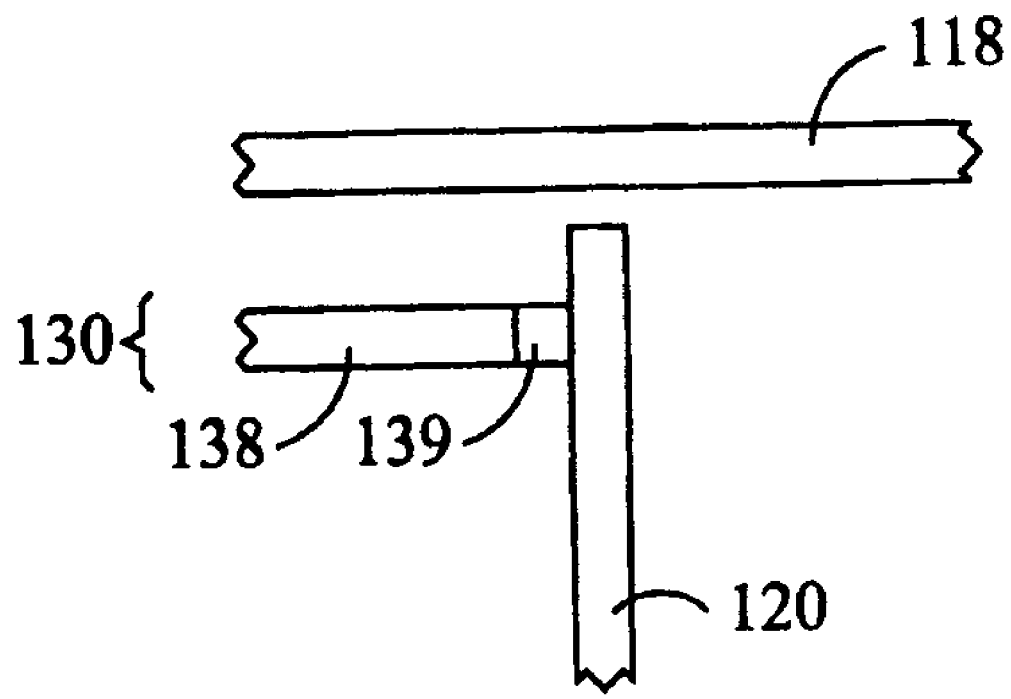
FIG. 3A illustrates an alternative structure from that shown in FIG. 3.

In one embodiment shown in FIG. 3A, the enclosure 120 may extend above the plate assembly 130. The plate assembly 130 is supported by the enclosure 120 by an insulator 139. The enclosure 120 may be raised prior to testing to make electrical interconnection between the enclosure 120 and the platen 118.

Figure 4:
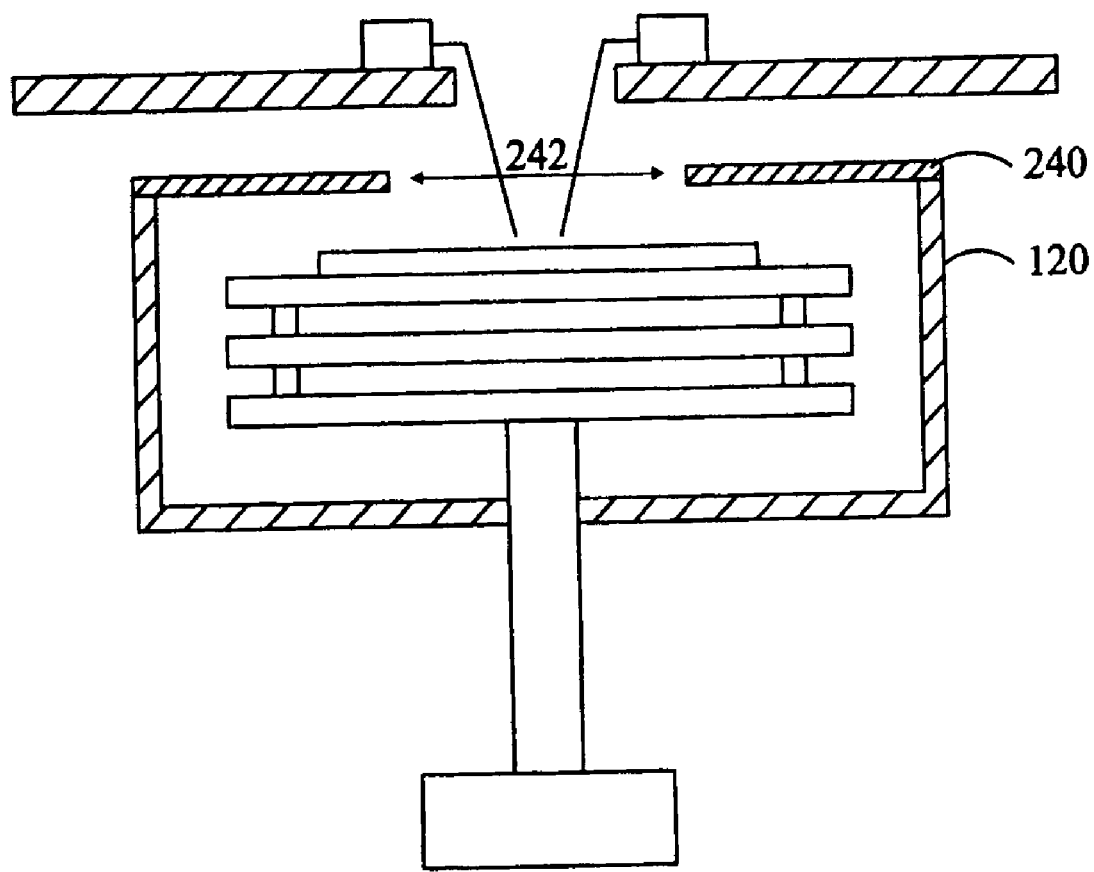
FIG. 4 shows a cross sectional view of another probe station that incorporates the present invention.

Referring to FIG. 4, the plate assembly may comprise a conductive member 240 with an opening 242 defined therein. The opening 242, unlike the opening defined by the plate assembly 130, does not move with respect to the enclosure 120. The elimination of the movable portions of the plate assembly 130 reduces mechanical complexity and potential sources of mechanical failure.

Figure 5:
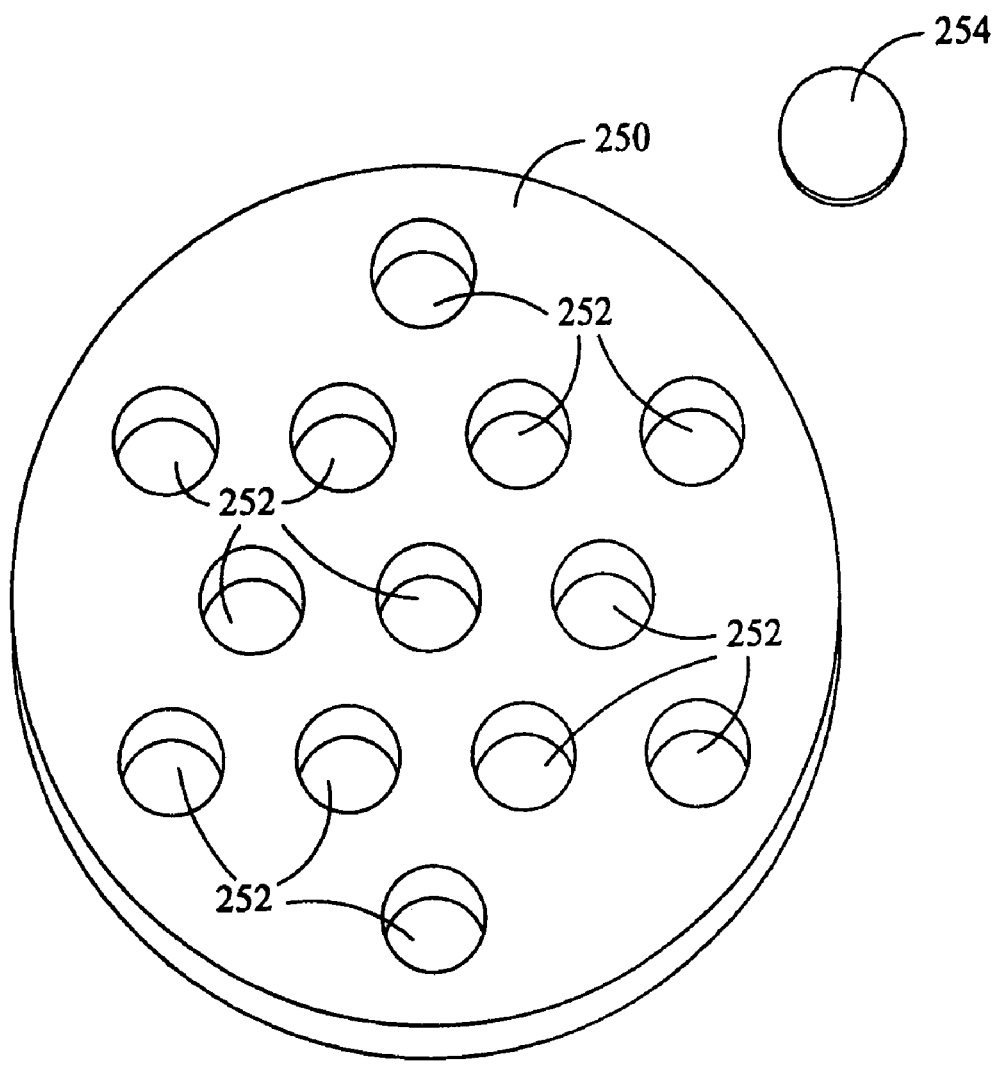
FIG. 5 shows a top view of a guarded member.

Referring to FIG. 5, the plate assembly may comprise a conductive member 250 with a plurality of openings 252 defined therein. One or more probes may be placed through one or more of the openings 252. The inclusion of a plurality of openings 252 permits probing of different regions of the wafer simultaneously that may not otherwise be accessible with a single opening. In addition, one or more conductive plates 254 may be placed over the unused openings to provide improved guarding/shielding and environmental enclosure. The chuck 112 may have some relative movement with respect to the conductive member 250 to assist the alignment of probes passing through the openings 252.

Figure 6:
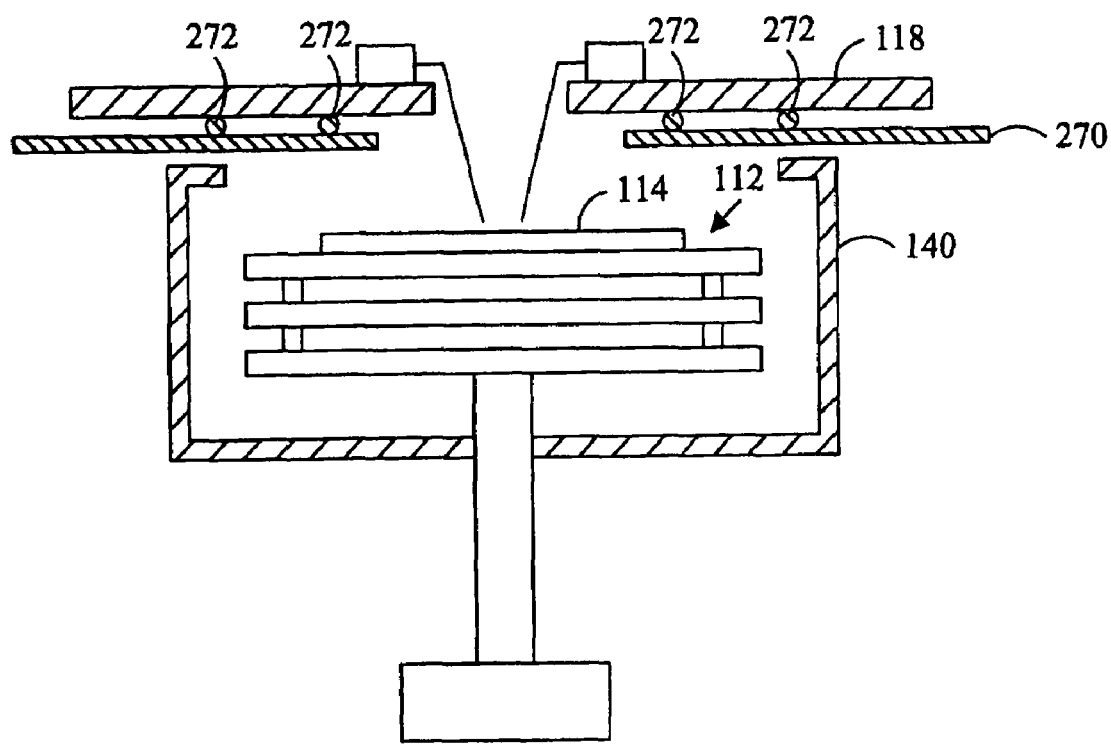
FIG. 6 shows a cross sectional view of another probe station that incorporates the present invention.

Referring to FIG. 6, the plate assembly may comprise a conductive member 270 may be supported by the platen 118 or otherwise free from being supported by the enclosure 140. The conductive member 270 may be movably engaged and/or slidably engaged with the platen 118 (or otherwise) such that the conductive member 270 is movable with respect to the platen 118. The movable engagement and/or slidable engagement may be provided by a roller based mechanism 272 or any other suitable mechanism. As the enclosure 140 and/or the chuck 112 is moved to reposition the probes for testing the wafer 114, the conductive member 270 is likewise repositioned. Preferably, the enclosure 140, chuck 112, and conductive member 270 are simultaneously moved laterally such that the portion of surface of the conductive member 270 opposing the enclosure 140 remains substantially unchanged. In this manner, during repositing of the enclosure 140 and/or chuck 112 different portions of the conductive member 270 will not come within the enclosure 140. This limits the amount of moisture that comes into the enclosure 140 with the wafer 114 as a result of relative movement of the conductive member 270 and the enclosure 140.

Figure 6A:
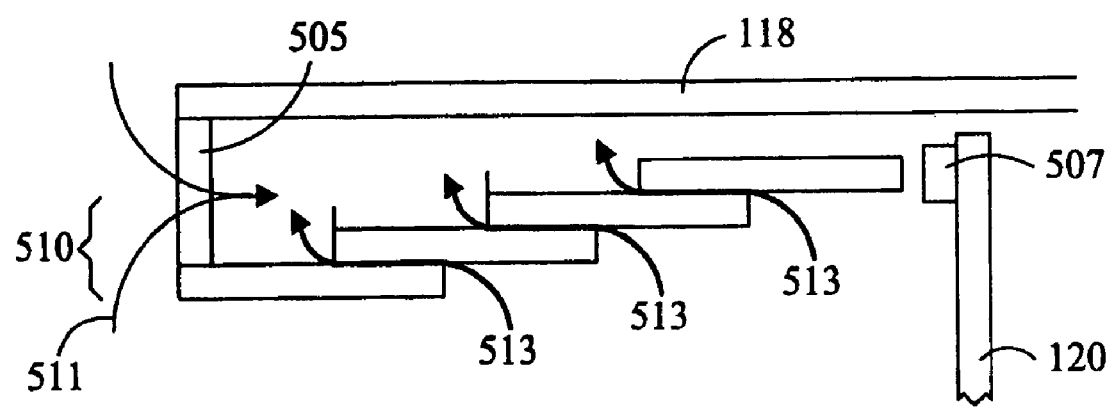
FIG. 6A shows an alternative structure from that shown in FIG. 6.

Referring to FIG. 6A, a plate assembly 510 may be supported by the platen 118 with a support 505. The plate assembly 510 may include multiple slidably engaged plates. The enclosure 120 may include a bumper 507. Movement of the enclosure 120 results in movement of the plate assembly 510 while maintaining the plate assembly 510 with the enclosure 120. The plate assembly 510, the support 505, the enclosure 120, the bumper 507 may be conductive or non-conductive, as desired, and interconnected to any suitable signal or potential. The air flow from within the enclosure 120 may flow above the plate assembly 510 (as shown by lines 511) and/or between the plates of the plate assembly 510 (as shown by lines 513). The air flow will tend to remove condensation from the region between the plate assembly 510 and the platen 118.

Figure 7:
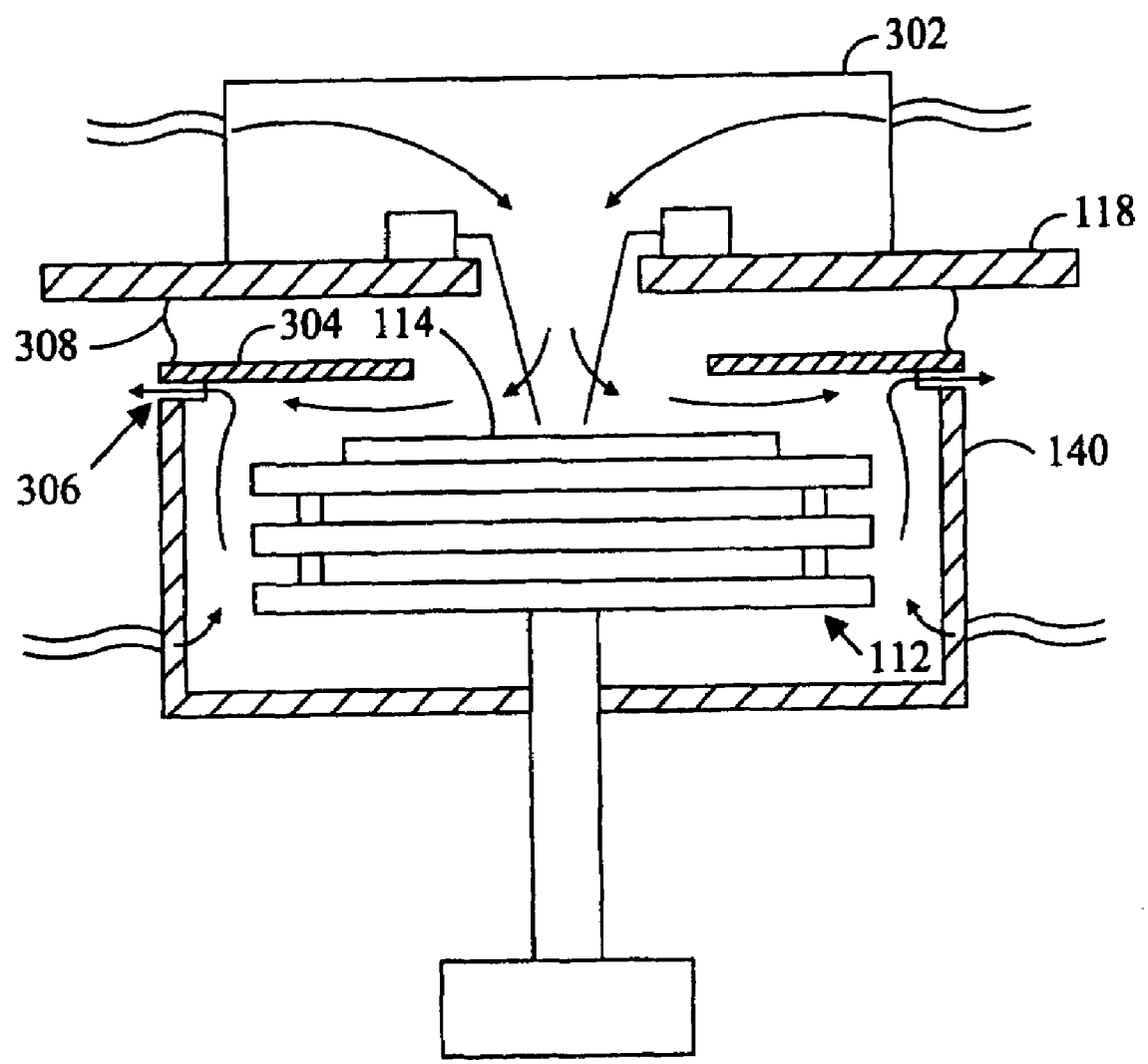
FIG. 7 shows a cross sectional view of another probe station that incorporates the present invention.

Referring to FIG. 7, the enclosure 140 and conductive assembly 304 spaced between the probing devices and the wafer 114 may include a top hat 302 thereon. The top hat 302 encloses at least a portion of the probes 116 and provides an air tight seal or otherwise a substantially air tight seal. In this manner, gaseous material, such as air, may be provided to the enclosure 140 and/or within the top hat 302 for probing. The gas flow will tend not to flow out though the platen 118 because the top hat 302 provides a substantially air tight seal and a majority of the gas flow will therefore tend to flow out an opening 306 (or a plurality of openings) between the sides of the enclosure 140 and the conductive assembly 304. The gas flow out the opening 306 has a tendency to purge undesirable moisture from the enclosure 140. Also, the gas flow out of the opening 306 likewise tends to reduce the air flow across the probes 116 which avoids unnecessary vibrations imposed on the probes 116. Similarly, the air may pass through one or more openings in the enclosure 140. Likewise, a seal 308 or other structure may be provided between the conductive assembly 304 and the platen 118 substantially to inhibit air from within the enclosure 140 to the exterior of the enclosure 140 in this region.

Figure 8:
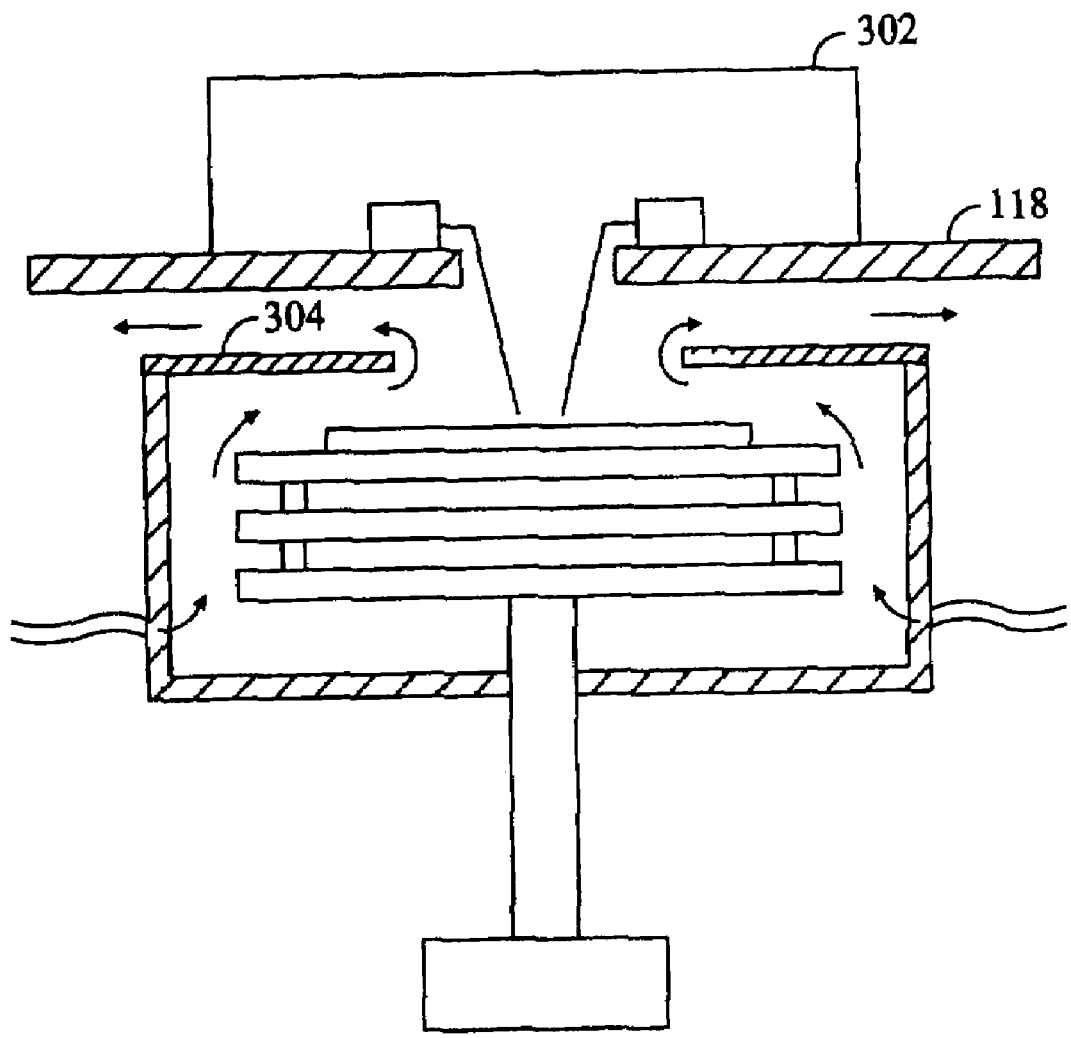
FIG. 8 shows a cross sectional view of another probe station that incorporates the present invention.

Referring to FIG. 8, an alternative structure includes an opening between the conductive assembly 304 and the platen 118, together with a top hat 302, such that the major portion of the gas exiting the enclosure 140 passes between the conductive assembly 304 and the platen 118. The gas will not tend to flow out through the platen 118 because the top hat 302 forms a substantially air tight seal.

Figure 9:
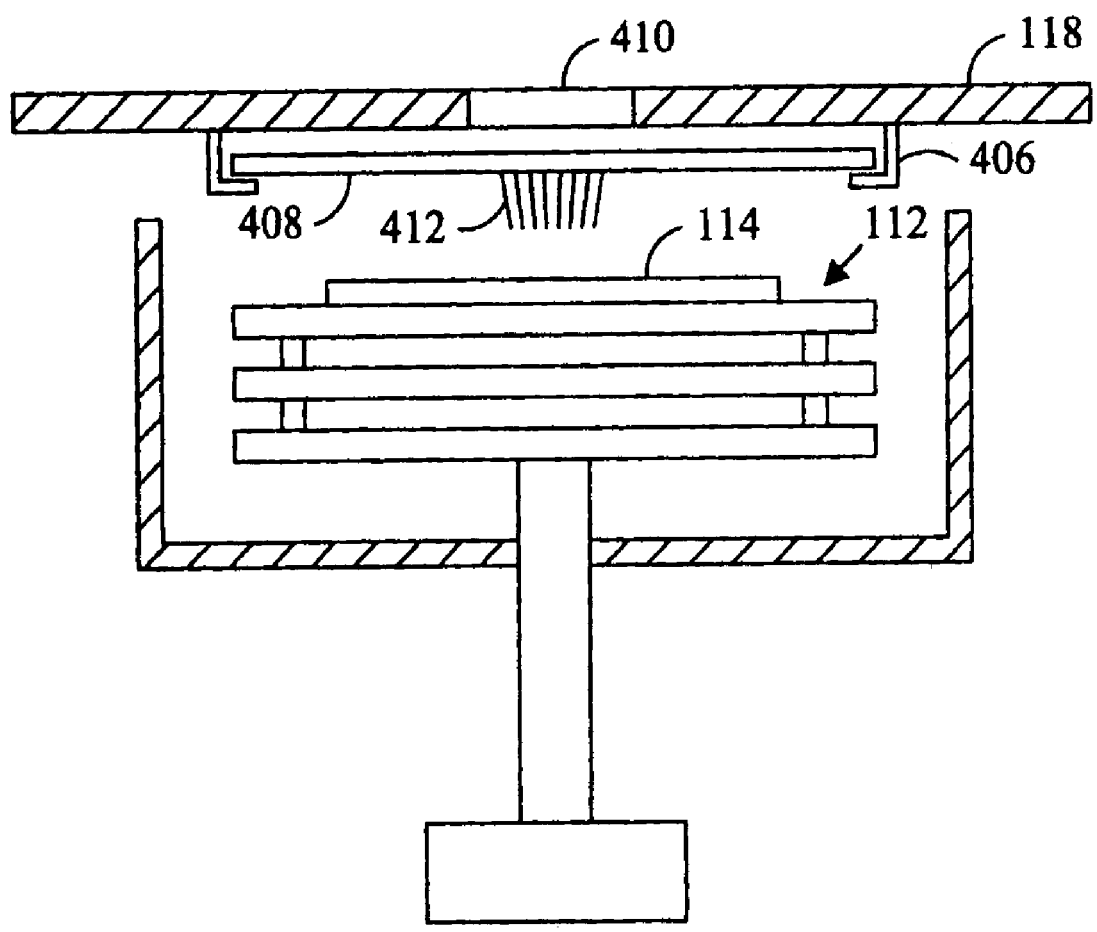
FIG. 9 shows a cross sectional view of another probe station that incorporates the present invention.

Referring to FIG. 9, another structure for a probe station includes a supporting structure 406 for a probe card 408. The probe card 408 supports a plurality of probe needles 412 that extend below the probe card 408. The probe needles 412 contact the wafer 114 for testing. The platen 118 is preferably a solid structure that prevents the passage of air through. In addition, the platen 118 may include a region 410 that is optically transparent. The transparent region 410 permits viewing of the probe needles 412 and the wafer 114 so that proper alignment of the probe needles 412 may be achieved using an exterior microscope.

Another potential probe station design would include the incorporation of the suspended guard member, as illustrated in FIG. 2, together with the moving "tub" enclosure as described herein. Such a design is may be most beneficial when the temperature range of testing is minimal or otherwise the condensation may be controlled. In addition, by providing air flow out of the "tub" across the lower surface of the suspended guarded member the condensation may be minimized.

Referring again to FIG. 6A, to load a wafer the enclosure 120 and chuck may be lowered below the conductive plate assembly. Then the enclosure 120 may be offset from the platen 118 to make loading the wafer easier. Thereafter, the enclosure 120 is raised back to its position with the conductive plate assembly. Alternatively, the lower portion of the enclosure 120 may be opened to permit the chuck therein to be lowered and raised with respect to the enclosure 120 to permit loading of a wafer.

Referring again to FIG. 3, the plate assembly 130 may be suspended from the platen 118 and the enclosure 120 together with the chuck lowered. Then the enclosure 120 may be offset from the platen 118 to make loading the wafer easier. Thereafter, the enclosure 120 is raised back to its position with the conductive plate assembly. Alternatively, the lower portion of the enclosure 120 may be opened to permit the chuck therein to be lowered and raised with respect to the enclosure 120 to permit loading of a wafer.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A probe station comprising:
    (a) a chuck surface for supporting a first surface of a device under test, said chuck surface having a chuck surface area;
    (b) a support for a probe arranged to engage an opposed second surface of said device under test; and
    (c) a conductive member interposed between and spaced apart from said chuck surface and said support, said conductive member coextensive with a major portion of said chuck surface area and including a portion constrained to move in conjunction with a lateral movement of said chuck surface, said conductive member further comprising a portion movable relative to said chuck surface and defining an aperture through which a probe can project to engage said device under test.

2. The probe station of claim 1 wherein said conductive member is coextensive with at least 60 percent of said chuck surface area.

3. The probe station of claim 1 wherein said conductive member is coextensive with at least 70 percent of said chuck surface area.

4. The probe station of claim 1 wherein said conductive member further comprises:
    (a) a first plate member secured to move laterally in conjunction with said lateral movement of said chuck surface and including portions defining a first aperture; and
    (b) a second plate member supported by and moveable relative to said first plate member and including a portion defining a second aperture, said probe projectable through a portion of said second aperture coincident with a portion of said first aperture.

5. The probe station of claim 4 further comprising a constraint to movement of said second plate relative to said support.

6. The probe station of claim 1 wherein a chuck comprising said chuck surface is, with the exception of said aperture, substantially enclosed by said conductive member and a tub affixed to said conductive member.

* * * * *